United States Patent
Matsumoto et al.

(10) Patent No.: US 7,598,100 B2
(45) Date of Patent: Oct. 6, 2009

(54) MANUFACTURING METHOD OF SEMICONDUCTOR INTEGRATED CIRCUIT DEVICE

(75) Inventors: Hideyuki Matsumoto, Tokyo (JP); Shingo Yorisaki, Tokyo (JP); Akio Hasebe, Tokyo (JP); Yasuhiro Motoyama, Tokyo (JP); Masayoshi Okamoto, Hitachinaka (JP); Yasunori Narizuka, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/719,112

(22) PCT Filed: Nov. 18, 2004

(86) PCT No.: PCT/JP2004/017160

§ 371 (c)(1),
(2), (4) Date: Feb. 6, 2009

(87) PCT Pub. No.: WO2006/054344

PCT Pub. Date: May 26, 2006

(65) Prior Publication Data

US 2009/0130785 A1    May 21, 2009

(51) Int. Cl.
 H01L 21/00    (2006.01)
 H01L 31/26    (2006.01)
 H01L 21/66    (2006.01)
 H01L 21/82    (2006.01)
(52) U.S. Cl. ............... 438/17; 438/10; 438/14; 438/15; 438/18; 438/107; 438/128; 438/129; 257/E21.522; 257/E21.531

(58) Field of Classification Search .......... 257/E21.522, 257/E21.531
See application file for complete search history.

(56) References Cited

U.S. PATENT DOCUMENTS

| 6,255,727 | B1 * | 7/2001 | Khoury ............... 257/693 |
| 6,927,079 | B1 * | 8/2005 | Fyfield ............... 438/14 |
| 2004/0070413 | A1 | 4/2004 | Kasukabe et al. | |
| 2005/0093565 | A1 * | 5/2005 | Okamoto et al. ......... 324/765 |
| 2005/0095734 | A1 * | 5/2005 | Hasebe et al. ............ 438/17 |
| 2007/0207559 | A1 * | 9/2007 | Hasebe et al. ............ 438/17 |
| 2008/0020498 | A1 * | 1/2008 | Okamoto et al. .......... 438/14 |

FOREIGN PATENT DOCUMENTS

| JP | 05-243344 | 9/1993 |
| JP | 05-283490 | 10/1993 |
| JP | 07-231019 | 8/1995 |

(Continued)

*Primary Examiner*—Savitri Mulpuri
*Assistant Examiner*—Mohsen Ahmadi
(74) *Attorney, Agent, or Firm*—Mattingly & Malur, P.C.

(57) ABSTRACT

As the thickness of the card holder for preventing warping of a multilayered wiring substrate 1 is increased, there occurs a problem that a thin film sheet 2 is buried in a card holder and secure contact between probes 7 and test pads cannot be realized. For its prevention, the thin film sheet 2 and a bonding ring 6 are bonded in a state where a tensile force is applied only to the central region IA of the thin film sheet 2, and a tensile force is not applied to an outer peripheral region OA. Then, the height of the bonding ring 6 defining the height up to the probe surface of the thin film sheet 2 is increased, thereby increasing the height up to the probe surface of the thin film sheet 2.

21 Claims, 21 Drawing Sheets

FOREIGN PATENT DOCUMENTS

| | | |
|---|---|---|
| JP | 07-283280 | 10/1995 |
| JP | 08-050146 | 2/1996 |
| JP | 08-201427 | 8/1996 |
| JP | 08-220138 | 8/1996 |
| JP | 10-300783 | 11/1998 |
| JP | 10-308423 | 11/1998 |
| JP | 11-023615 | 1/1999 |
| JP | 11-097471 | 4/1999 |
| JP | 11-248749 | 9/1999 |
| JP | 11-248759 | 9/1999 |
| JP | 2000-138268 | 5/2000 |
| JP | 2000-150594 | 5/2000 |
| JP | 2001-060758 | 3/2001 |
| JP | 2001-116796 | 4/2001 |
| JP | 2001-159643 | 6/2001 |
| JP | 2001-319953 | 11/2001 |
| JP | 2002-139554 | 5/2002 |
| JP | 2002-257856 | 9/2002 |
| JP | 2003-031628 | 1/2003 |
| JP | 2003-282654 | 10/2003 |
| JP | 2004-132699 | 4/2004 |
| JP | 2004-144742 | 5/2004 |
| JP | 2004-288672 | 10/2004 |
| JP | 2005-024377 | 1/2005 |
| JP | 2005-136246 | 5/2005 |
| JP | 2005-136302 | 5/2005 |
| JP | 2005302917 | 10/2005 |

* cited by examiner

MANUFACTURING METHOD OF SEMICONDUCTOR INTEGRATED CIRCUIT DEVICE

TECHNICAL FIELD

The present invention relates to a technology for manufacturing a semiconductor integrated circuit device. More particularly, it relates to a technology effectively applied to an electrical inspection of a semiconductor integrated circuit in which a number of electrode pads are arranged in a fine pitch manner.

BACKGROUND ART

Japanese Patent Application Laid-Open Publication No. 2001-116796 (Patent Document 1 (corresponding European Patent Publication EP 1074844)) has disclosed an IC device, a method and a device for testing solder balls on a wafer, in which the solder balls in an IC array are reshaped so that all the contact surfaces of the solder balls in the IC array are in one plane, and a uniform offset is provided between the contact surfaces of the solder balls and an IC substrate, thereby significantly reducing pressure required for contacting all solder bumps in the IC array to a testing array.

Further, Japanese Patent Application Laid-Open Publication No. 5-283490 (Patent Document 2) has disclosed a technology. According to the technology, when an integrated circuit device is electrically connected to a test measurement device by contacting the contact terminals of needles in probing means to the bump electrodes of each integrated circuit device formed in a semiconductor wafer, bump electrodes of the adjacent semiconductor integrated circuit device in the wafer are pressed by a pressing member to deform the tip portions thereof, thereby equalizing the heights of the bump electrodes. By this means, since the semiconductor integrated circuit device having bump electrodes with uniform height can be connected to the test measurement device at a uniform contact resistance through the probing means, the measurement accuracy can be improved, and the variation in contact resistance between the bump electrodes and the mounting side of the integrated circuit device when the integrated circuit device is mounted can be also reduced.

Further, Japanese Patent Application Laid-Open Publication No. 2001-60758 (Patent Document 3 (corresponding to United States Patent Publication No. 6,391,686) has disclosed a technology. According to the technology, adhesive materials are provided on a wiring substrate comprising a base substrate having a plurality of first regions to be punched out and a plurality of second regions between the first regions and wiring patterns formed at least in the above-described first regions of the base substrate, and parts of the adhesive materials provided in the above-described first regions are pressed and made to flow into the above-described second regions. By this means, the bubbles formed at the corners among the base substrate, the wiring substrate, and the wiring pattern in the first regions are moved to the second regions, and the adhesive materials are crimped to the wiring substrate, thereby removing the bubbles from the first regions.

Further, Japanese Patent Application Laid-Open Publication No. 10-300783 (Patent Document 4) has disclosed a contact probe in which a plurality of pattern wirings are formed on a film, and each of the tips of the pattern wirings protrudes from the film to be a contact pin. In this contact probe, power supply line layers including the predetermined plurality of power supply lines are laminated on the film surface on the side where the pattern wirings are formed, and each of the power supply lines is connected to the predetermined pattern wiring so that the power supply line layers are three-dimensionally provided for the pattern wirings. By this means, since the design flexibility of the wide power supply lines through which large current can flow can be improved and the heat in the power supply lines can be efficiently diffused, it is possible to prevent the breakage of the wirings.

Further, Japanese Patent Application Laid-Open Publication No. 2001-319953 (Patent Document 5) has disclosed a technology. According to the technology, in a prober having a structure in which a wafer chuck mechanism is provided with a heat plate, a probe card is placed on a card retainer, and the card retainer is fixed to a head plate, by providing a heater and a temperature sensor to the card retainer and heating the card retainer to a predetermined temperature, the temperature of the card retainer is kept constant without being influenced by the heat of the chuck mechanism. By this means, the fluctuation of a position of a probe pin due to the deformation of the card retainer caused by the temperature change can be prevented.

Further, Japanese Patent Application Laid-Open Publication No. 2000-138268 (Patent Document 6) has disclosed a technology. According to the technology, instead of the inspection which is performed by contacting a probe provided on a probe card while heating a semiconductor circuit formed on the surface of the wafer from a rear surface of the wafer, the inspection is performed while heating the surface of the probe card which is not in contact with the wafer. By this means, the amount of thermal deformation of the probe card is reduced and the accuracy of probing tests is improved.

DISCLOSURE OF THE INVENTION

As an inspection technology of a semiconductor integrated circuit device, a probe inspection has been known. The probe inspection includes, for example, a function test for confirming whether or not predetermined functions are achieved and a test in which DC operating characteristics and AC operating characteristics are checked to determine whether a semiconductor integrated circuit device is defective or not.

Recently, functionality of a semiconductor integrated circuit device has been expanded, and a plurality of circuits have been packaged in one semiconductor chip (hereinafter, simply referred to as a chip). Further, in order to reduce the manufacturing cost of a semiconductor integrated circuit device, the semiconductor elements and the wirings thereof are miniaturized, and an area of the semiconductor chip (hereinafter, simply referred to as a chip) is reduced, thereby increasing the number of chips acquired from one wafer. Accordingly, not only the number of test pads (bonding pads) is increased, but also the test pads are arranged in a finer pitch manner, and the area of the test pad is reduced. Due to the finer pitch arrangement of test pads as described above, when a prober having probe pins with a cantilever shape is to be used for the probe inspection, there occurs a problem that it is difficult to set the probe pins to the arranged positions of the test pads.

One typical object of the present invention disclosed in this application is to provide a technology according to which an electrical inspection for a semiconductor integrated circuit device in which test pads are arranged in a finer pitch manner can be realized.

Also, another typical object of the present invention disclosed in this application is to provide a technology according to which contact between probe pins and test pads in the probe inspection can be ensured.

The typical ones of the inventions disclosed in this application will be briefly described as follows.

A manufacturing method of a semiconductor integrated circuit device according to the present invention comprises the following steps.

That is, (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface, (b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; a plurality of pogo pins in contact with the first wiring substrate from a second surface on the other side of a first surface on which the first sheet is attached, the pogo pins transmitting an electric signal to each of the plurality of contact terminals; a bonding ring which holds a first region in the first sheet in which the plurality of contact terminals are formed, while separating the first region from the first substrate and applying tensile forces; a pressing mechanism which presses the first region in the first sheet from a rear surface thereof; and a first fixing substrate which fixes the first wiring substrate from a side of the first surface, and (c) performing electrical inspection of the semiconductor integrated circuit by contacting the tips of the plurality of contact terminals with the plurality of first electrodes.

In this method, each of the tips of the plurality of contact terminals is disposed on the main surface of the first sheet, so as to oppose to corresponding one of the plurality of first electrodes, and a second region surrounding the first region in the first sheet is held to the first substrate in an unstrained state.

Also, a manufacturing method of a semiconductor integrated circuit device according to the present invention comprises the following steps.

That is, (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface, (b) preparing a first card including: a first wiring substrate having a first wiring formed thereon; a second fixing substrate attached to a second region on a first surface of the first wiring substrate; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the second wiring substrate, opposing to the main surface of the semiconductor wafer; a plurality of pogo pins in contact with the first wiring substrate from a second surface on the other side of the first surface, the pogo pins transmitting an electric signal to each of the plurality of contact terminals; a pressing mechanism which presses a first region in the first sheet in which the plurality of contact terminals are formed, from a rear surface thereof; and a first fixing substrate which fixes the first wiring substrate in a fourth region except the third region from a side of the first surface, and (c) performing electrical inspection of the semiconductor integrated circuit by contacting the tips of the plurality of contact terminals with the plurality of first electrodes.

In this method, each of the tips of the plurality of contact terminals is disposed on the main surface of the first sheet, so as to oppose to corresponding one of the plurality of first electrodes.

Also, a manufacturing method of a semiconductor integrated circuit device according to the present invention comprises the following steps.

That is, (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface, (b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, and (c) performing electrical inspection of the semiconductor integrated circuit by contacting the tips of the plurality of contact terminals with the plurality of first electrodes.

In this method, each of the tips of the plurality of contact terminals is disposed on the main surface of the first sheet, so as to oppose to corresponding one of the plurality of first electrodes, and one or more holes are formed in the first sheet at positions away from the second wiring and the plurality of contact terminals.

Also, a manufacturing method of a semiconductor integrated circuit device according to the present invention comprises the following steps.

That is, (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface, (b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, and (c) performing electrical inspection of the semiconductor integrated circuit by contacting the tips of the plurality of contact terminals with the plurality of first electrodes.

In this method, each of the tips of the plurality of contact terminals is disposed on the main surface of the first sheet, so as to oppose to corresponding one of the plurality of first electrodes, the second wiring includes a third wiring and a fourth wiring which is formed on the third wiring and is electrically connected to the third wiring, a fifth wiring which is not electrically connected to the third wiring is formed in a wiring layer in which the fourth wiring is formed, and at least one of the fourth wiring and the fifth wiring is formed on each third wiring.

Also, a manufacturing method of a semiconductor integrated circuit device according to the present invention comprises the following steps.

That is, (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface, (b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, (c) pressing the first sheet by the pressing mechanism at a first temperature to apply a first force to the first sheet, thereby reducing tensile force of the first sheet itself, and (d) after the step (c), performing electrical inspection of the semiconductor integrated circuit by contacting the tips of the plurality of contact terminals with the plurality of first electrodes.

In this method, each of the tips of the plurality of contact terminals is disposed on the main surface of the first sheet, so as to oppose to corresponding one of the plurality of first electrodes, and the first temperature is a temperature at which the tensile force of the first sheet itself is reduced by applying the first force to the first sheet.

Further, other aspects disclosed in this application will be briefly described in the following items.

1. A probe card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; a plurality of pogo pins in contact with the first wiring substrate from a second surface on the other side of a first surface on which the first sheet is attached, the pogo pins transmitting an electric signal to each of the plurality of contact terminals; a bonding ring which holds a first region in the first sheet in which the plurality of contact terminals are formed, while separating the first region from the first substrate and applying tensile forces; a pressing mechanism which presses the first region in the first sheet from a rear surface thereof; and a first fixing substrate which fixes the first wiring substrate from a side of the first surface, wherein a second region surrounding the first region in the first sheet is held to the first substrate in an unstrained state.

2. A probe card including: a first wiring substrate having a first wiring formed thereon; a second fixing substrate attached to a third region on a first surface of the first wiring substrate; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the second wiring substrate, opposing to the main surface of the semiconductor wafer; a plurality of pogo pins in contact with the first wiring substrate from a second surface on the other side of the first surface, the pogo pins transmitting an electric signal to each of the plurality of contact terminals; a pressing mechanism which presses a first region in the first sheet in which the plurality of contact terminals are formed, from a rear surface thereof; and a first fixing substrate which fixes the first wiring substrate in a fourth region except the third region from a side of the first surface.

3. A probe card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, wherein one or more holes are formed in the first sheet at positions away from the second wiring and the plurality of contact terminals.

4. A probe card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, wherein the second wiring includes a third wiring and a fourth wiring which is formed on the third wiring and is electrically connected to the third wiring, a fifth wiring which is not electrically connected to the third wiring is formed in a wiring layer in which the fourth wiring is formed, and at least one of the fourth wiring and the fifth wiring is formed on each third wiring.

5. A probe card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof, wherein the first sheet is pressed by the pressing mechanism at a first temperature in a state where the first sheet is held to the first wiring substrate, a tensile force is reduced by applying a first force, and the first temperature is a temperature at which the tensile force of the first sheet itself is reduced by applying the first force to the first sheet.

The effects obtained by typical aspects of the present invention will be briefly described below.

(1) In the probe inspection for a semiconductor integrated circuit device in which test pads are arranged in a fine pitch manner, the contact between probe pins and the test pads can be ensured.

(2) Even when a card holder preventing the warp of the multilayered wiring substrate is thick in a probe card, it is possible to prevent the problem that a thin film sheet having probes formed therein is buried in the card holder.

BEST MODE FOR CARRYING OUT THE INVENTION

Figure 1:
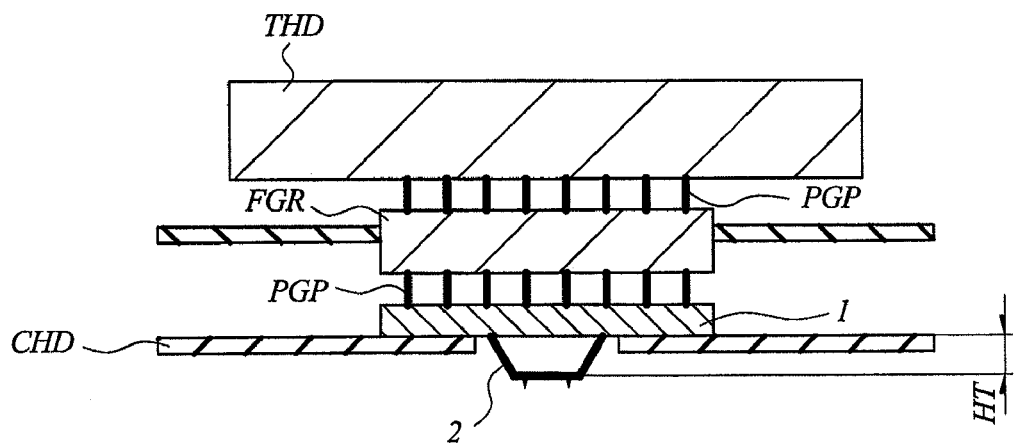
FIG. 1 is a cross sectional view showing the principal part of a probe card according to an embodiment of the present invention.

Before the detailed description of the present invention, meanings of the terms used in this application will be described as follows.

A wafer indicates a single crystal silicon substrate (with a substantially circular planar shape in general) used for manufacturing an integrated circuit, a silicon-on-insulator (SOI) substrate, a sapphire substrate, a glass substrate, other insulating, semi-insulating, or semiconductor substrate, or a combined substrate thereof. Further, a semiconductor integrated circuit device mentioned in this application is assumed to include not only a device formed on a semiconductor or insulating substrate such as a silicon wafer or a sapphire substrate but also a device formed on other insulating substrates such as glass, for example, a thin film transistor (TFT) and a super-twisted-nematic (STN) liquid crystal unless otherwise specified.

A device surface indicates a main surface of a wafer, on which device patterns corresponding to a plurality of chip regions are formed by lithography.

A contact terminal is assumed to be obtained by integrally forming a wiring layer and a tip portion electrically connected thereto through a wafer process similar to that used to a silicon wafer for manufacturing a semiconductor integrated circuit, such as a patterning technique combining a photolithography technology, a chemical vapor deposition (CVD) technology, a sputtering technology, an etching technology, and others.

A membrane probe, a membrane probe card, or a protruding-pin wiring sheet composite body indicates a thin film with a thickness of about 10 μm to about 100 μm in which contact terminals (protruding pins) to be in contact with an object to be inspected are provided and wirings extended therefrom are provided and electrodes for external contact are formed to the wirings.

A probe card indicates a structure having contact terminals to be in contact with a wafer to be inspected, a multilayered wiring substrate, and others. A semiconductor inspection device indicates an inspection device having a probe card and a sample support system on which a wafer to be inspected is placed.

Probe inspection indicates electrical test performed using a prober for a wafer obtained by completing a wafer process, in which the tip of the above-described contact terminal is put onto an electrode formed on the main surface of a chip region to conduct electrical inspection of a semiconductor integrated circuit. In the probe inspection, a function test for confirming whether or not predetermined functions are achieved and a test in which DC operating characteristics and AC operating characteristics are checked to determine whether a semiconductor integrated circuit device is defective or not are performed. The probe inspection is distinguished from a selection test (final test) conducted after dividing a wafer into chips (or after completion of packaging).

A tester (test system) mentioned here is used to electrically inspect a semiconductor integrated circuit, and it generates signals to be a predetermined voltage, reference timing and others.

A tester head mentioned here is electrically connected to a tester, receives voltages and signals transmitted from the tester, generates signals such as voltages and detailed timing for a semiconductor integrated circuit, and sends the signals to a probe card through pogo pins and the like.

A frog ring mentioned here is electrically connected to a tester head and a probe card through pogo pins and the like, and it sends a signal sent from the tester head to the probe card described later.

A prober indicates an inspection device having a sample support system which includes a frog ring, a probe card, and a wafer stage on which a wafer to be inspected is placed.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted.

Also, in the drawings used in the embodiments, hatching is used in some cases even in a plan view so as to make the drawings easy to see.

Furthermore, an insulating gate field effect transistor including a metal oxide semiconductor field effect transistor (MOSFET) is called a metal insulator semiconductor field effect transistor (MISFET) in the embodiments.

Moreover, the detailed contents of membrane probes based on a semiconductor lithography technology used in this application will not be repeated except when the need arises particularly, because the contents have been disclosed in the following patent applications by the inventors of the present invention and the related inventors. That is, the above-described patent applications are: Japanese Patent Application No. 6-22885; Japanese Patent Application Laid-Open Publication No. 7-283280; Japanese Patent Application Laid-Open Publication No. 8-50146; Japanese Patent Application Laid-Open Publication No. 8-201427; Japanese Patent Application No. 9-119107; Japanese Patent Application Laid-Open Publication No. 11-23615; Japanese Patent Application Laid-Open Publication No. 2002-139554; Japanese Patent Application Laid-Open Publication No. 10-308423; Japanese Patent Application No. 9-189660; Japanese Patent Application Laid-Open Publication No. 11-97471; Japanese Patent Application Laid-Open Publication No. 2000-150594; Japanese Patent Application Laid-Open Publication No. 2001-159643; Japanese Patent Application No. 2002-289377 (corresponding U.S. application Ser. No. 10/676,609 (United States application date: Oct. 2, 2003)); Japanese Patent Application No. 2002-294376; Japanese Patent Application No. 2003-189949; Japanese Patent Application No. 2003-75429 (corresponding to U.S. application Ser. No. 10/765,917 (United States application date: Jan. 29, 2004)); Japanese Patent Application No. 2003-344304; Japanese Patent Application No. 2003-371515; Japanese Patent Application No. 2003-372323; and Japanese Patent Application No. 2004-115048.

Hereinafter, embodiments of the present invention will be described in detail with reference to drawings.

FIG. 1 is a cross sectional view showing the principal part of a probe card (first card) according to the present embodiment. As shown in FIG. 1, the probe card according to the present embodiment includes: a multilayered wiring substrate (first wiring substrate) 1; a thin film sheet (first sheet) 2;

a tester head THD; a frog ring FGR; a card holder (first fixing substrate) CHD; and others. An electrical connection between the tester head THD and the frog ring FGR and that between the frog ring FGR and the multilayered wiring substrate 1 are made through a plurality of pogo pins PGP, respectively. Accordingly, the tester head THD and the multilayered wiring substrate 1 are electrically connected to each other. The card holder CHD mechanically connects the multilayered wiring substrate 1 and the prober, and it has a mechanical strength which prevents warping of the multilayered wiring substrate 1 due to the pressure from the pogo pins PGP.

Figure 2:
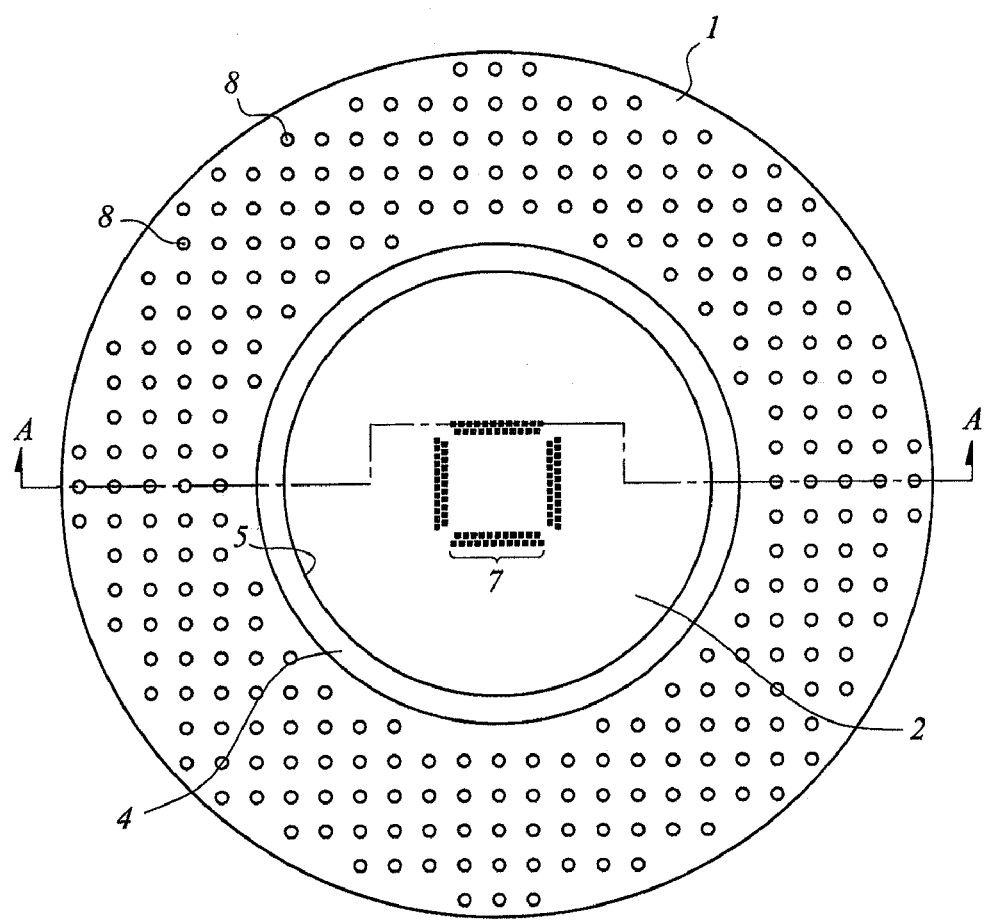
FIG. 2 is a plan view showing the principal part of a lower surface of a probe card according to an embodiment of the present invention.
Figure 3:
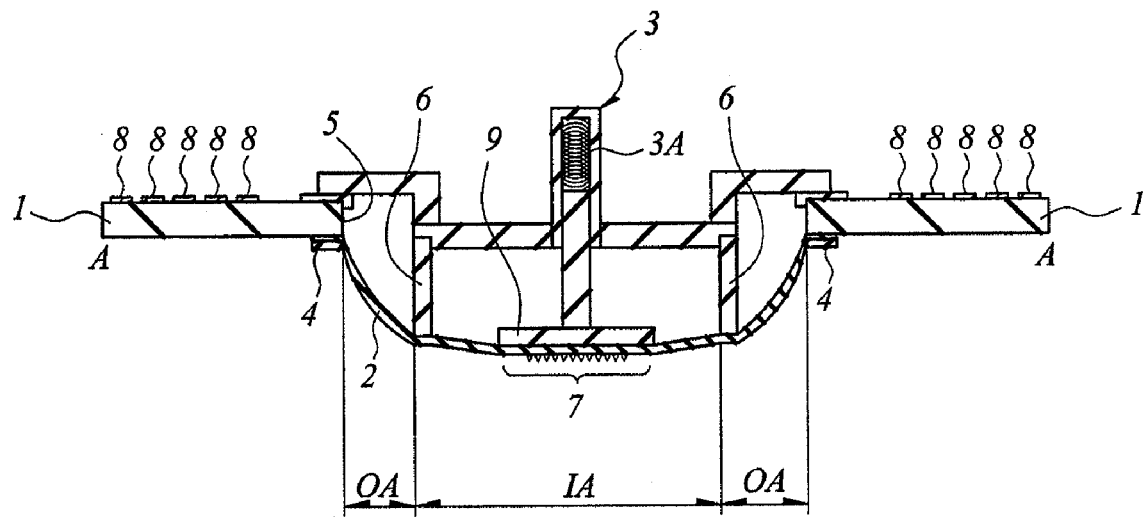
FIG. 3 is a cross sectional view taken along the line A-A in FIG. 2.

FIG. 2 is a plan view showing the principal part of the lower surface of the probe card according to the present embodiment, and FIG. 3 is a cross sectional view taken along the line A-A in FIG. 2.

As shown in FIG. 2 and FIG. 3, the probe card according to the present embodiment includes a plunger 3 and others in addition to the components shown in FIG. 1. The thin film sheet 2 is fixed to the lower surface of the multilayered wiring substrate 1 by a holding ring 4, and the plunger 3 is attached to the upper surface of the multilayered wiring substrate 1. An opening 5 is provided in the central portion of the multilayered wiring substrate 1, and the thin film sheet 2 and the plunger 3 are bonded to each other through a bonding ring 6 in the opening 5.

A plurality of probes (contact terminals) 7 with a shape of, for example, a quadrangular pyramid or a truncated quadrangular pyramid are formed on the lower surface of the thin film sheet 2. A plurality of wirings (second wirings), each of which is electrically connected to the probe 7 and extends from each probe 7 to an end portion of the thin film sheet 2, are formed in the thin film sheet 2. A plurality of receiving portions (not shown), which are electrically connected to the end portions of the plurality of wirings, are formed on the upper or lower surface of the multilayered wiring substrate 1, and the plurality of receiving portions are electrically connected to a plurality of pogo seats 8 provided on the upper surface of the multilayered wiring substrate 1 through the wirings (first wirings) formed in the multilayered wiring substrate 1. The pogo seat 8 has a function to receive a pin through which a signal from the tester is introduced to the probe card.

In the present embodiment, the thin film sheet 2 is formed of, for example, a thin film mainly made of polyimide. The thin film sheet 2 as described above has flexibility. Therefore, in the present embodiment, the plunger 3 presses the thin film sheet 2 in the region where the probes 7 are formed, from the upper surface (rear surface) thereof via a pressing tool 9 in order to bring all the probes 7 into contact with the pads of a chip (semiconductor integrated circuit device). More specifically, constant pressure is applied to a pressing tool (pressing mechanism) 9 by an elastic force of a spring 3A disposed in the plunger 3. In the present embodiment, for example, 42 alloy can be used as the material of the pressing tool 9.

In this case, as the number of test pads (bonding pads) formed on the surface of the chip to be inspected is increased, the number of the pogo pins PGP to send a signal to each of the test pads is increased accordingly. Further, when the number of the pogo pins PGP is increased, the pressure applied to the multilayered wiring substrate 1 from the pogo pins PGP are also increased. Therefore, the thickness of the card holder CHD is required to be increased in order to prevent warping of the multilayered wiring substrate 1. In addition, in order to surely bring each of the probes 7 formed on the thin film sheet 2 into contact with a corresponding test pad, a tensile force is applied to both of a central region (first region) IA (refer to FIG. 3) of the thin film sheet 2 and an outer peripheral region (second region) OA (refer to FIG. 3) which is on the outer peripheral side from the bonding ring and surrounds the central region IA. In such a structure, however, there is a limit in height HT (refer to FIG. 1) from the surface of the multilayered wiring substrate 1 to the probe surface of the thin film sheet 2, and the limit value of the height HT is about 3.5 mm according to the experiments by the inventors of the present invention. When the thickness of the card holder CHD is larger than the limit value of the height HT, the thin film sheet 2 is buried in the card holder CHD, and there occurs a problem that the contact between the probes 7 and the test pad cannot be ensured.

For its prevention, the present embodiment provides a structure in which the thin film sheet 2 and the bonding ring 6 are bonded in a state where a tensile force is applied only to the central region IA of the thin film sheet 2 and a tensile force is not applied to the outer peripheral region OA. At this time, metal (for example, 42 alloy) having a thermal expansion coefficient approximately the same as that of silicon (Si) is selected as a material of the bonding ring 6, and epoxy type adhesive is used as adhesive for bonding the thin film sheet 2 and the bonding ring 6. By this means, the height of the bonding ring 6 which defines the height HT up to the probe surface of the thin film sheet 2 can be increased. Accordingly, the height HT can be increased, and it is possible to prevent the problem that the thin film sheet 2 is buried in the card holder CHD. That is, even when the card holder CHD is thick, the contact between the probes 7 and the test pads can be ensured.

Figure 4:
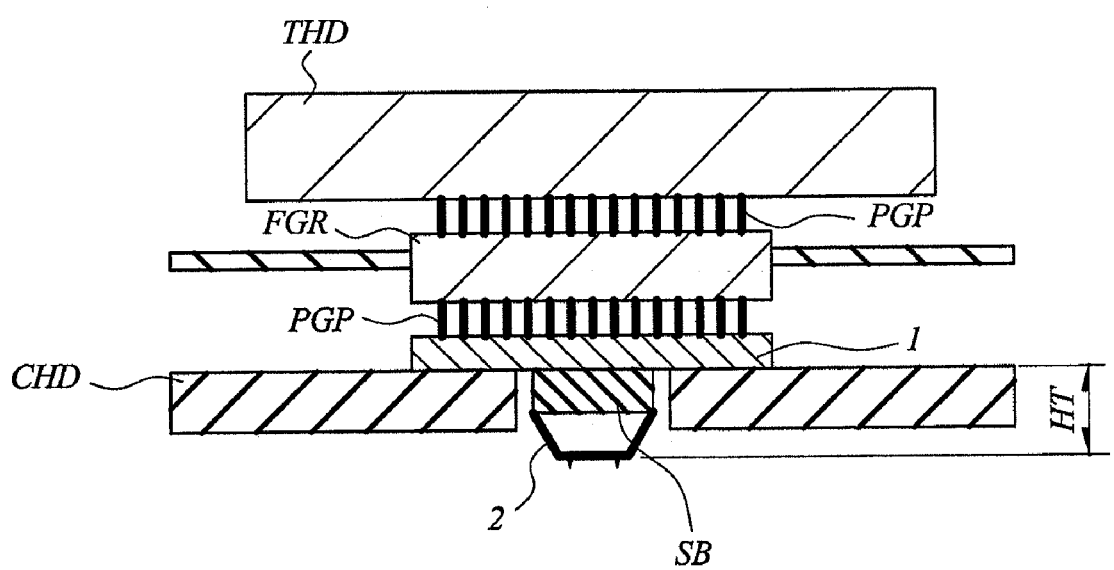
FIG. 4 is a cross sectional view showing the principal part of a probe card according to an embodiment of the present invention.

Other than the structure described above, by attaching a subsidiary substrate (second fixing substrate) SB to the central portion (third region) of the multilayered wiring substrate 1 as shown in FIG. 4 and attaching the thin film sheet 2 to the subsidiary substrate SB, the height HT from the surface of the multilayered wiring substrate 1 to the probe surface of the thin film sheet 2 can be increased. Similar to the multilayered wiring substrate 1, a plurality of wirings are formed in the subsidiary substrate SB, and a plurality of receiving portions (not shown) which are electrically in contact with the end portions of the wirings are formed in the subsidiary substrate SB. With regard to the receiving portions provided in the multilayered wiring substrate 1 and the receiving portions provided in the subsidiary substrate SB, for example, the portions corresponding to each other are electrically connected by soldering. Instead of the above-described method using soldering, a method in which the multilayered wiring substrate 1 and the subsidiary substrate SB are crimped via anisotropic conductive rubber can be used, and further, a method in which protruding portions made of plated copper (Cu) electrically connected to the above-described receiving portions are formed on the surface of the multilayered wiring substrate 1 and that of the subsidiary substrate SB, and the protruding portions corresponding to each other are crimped can be used.

Figure 36:
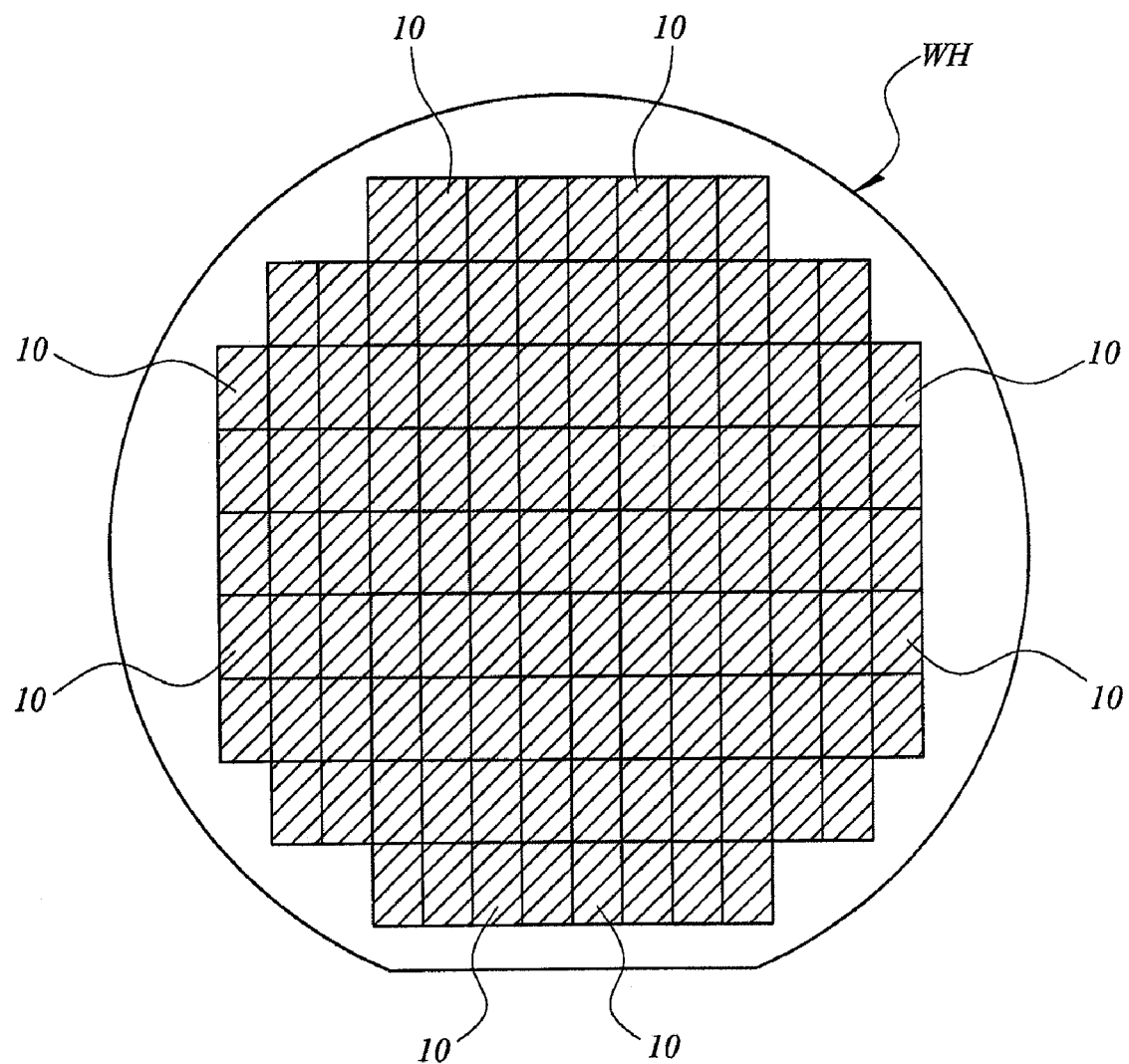
FIG. 36 is a plan view of a semiconductor wafer provided with semiconductor chip regions to be objects of the probe inspection using a probe card according to an embodiment of the present invention.

In the present embodiment, for example, an object to be a target of the probe inspection (electrical inspection) using the above-described probe card is a chip on which a liquid crystal display (LCD) driver is formed. FIG. 36 is a plan view of a wafer WH on which the plurality of chips (chip regions) 10 are defined. Note that the probe inspection using the probe card according to the present embodiment is performed to the wafer WH on which the plurality of chips 10 are defined. Further, FIG. 5 includes a plan view of the chip 10 and an enlarged view of a part of the chip 10. The chip 10 is formed of, for example, a single crystal silicon substrate, and an LCD driver circuit is formed on the main surface thereof. Also, a number of pads (test pads (first electrodes)) 11 and 12 which are electrically connected to the LCD driver circuit are arranged on the periphery of the main surface of the chip 10, the pads 11 arranged along the upper long side and the both short sides of the chip 10 in FIG. 5 function as output terminals, and the pads 12 arranged along the lower long side of the chip 10 function as input terminals. Since the number of the output terminals is larger than that of the input terminals in the LCD driver circuit, in order to increase the space between the adjacent pads 11 as much as possible, the pads 11 are arranged in two lines along the upper long side and the both short sides of the chip 10. In other words, the pads 11 are arranged in a staggered manner along the upper long side and the both short sides of the chip 10. In the first embodiment, a pitch LP for the pads 11 arranged adjacently is, for example, about 68 μm. Also, in the present embodiment, the pad 11 has a rectangular planar shape, and the length LA of the long side thereof extending in the direction intersecting with (perpendicular to) the outer periphery of the chip 10 is about 63 μm. Further, the length LB of the short side thereof extending along the outer periphery of the chip 10 is about 34 μm. Moreover, since the pitch LP for the pads 11 arranged adjacently is about 68 μm and the length LB of the short side of the pad 11 is about 34 μm, the space between the pads 11 adjacent to each other is about 34 μm.

Figure 6:
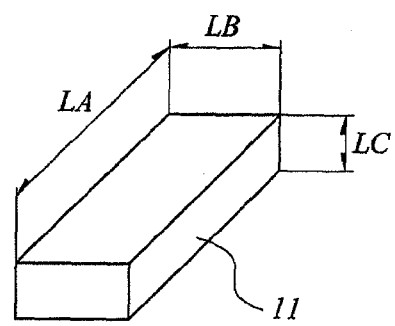
FIG. 6 is a perspective view of a pad formed on the semiconductor chip shown in FIG. 5.

The pads 11 and 12 are bump electrodes (protruding electrodes) made of, for example, gold (Au) and are formed on the input-output terminals (bonding pads) of the chip 10 by such a method as electroplating, electroless plating, vacuum evaporation, or sputtering. FIG. 6 is a perspective view of the pad 11. The height LC of the pad 11 is about 15 μm, and the pad 12 has a height similar to that of the pad 11.

Further, after LCD driver circuits (semiconductor integrated circuits) and input-output terminals (bonding pads) are formed on a number of chip regions defined on the main surface of the wafer by using a semiconductor manufacturing technology and the pads 11 are formed on the input-output terminal in the manner described above, the wafer is divided into the respective chip regions through the wafer dicing. In this manner, the chips 10 are manufactured. Furthermore, in the present embodiment, the above-described probe inspection is performed for the chip regions before the wafer dicing. Hereinafter, in the description of the probe inspection (process in which the pads 11 and 12 are in contact with the probes 7), the chip 10 indicates each of the chip regions before the wafer dicing, unless otherwise specified.

Figure 7:
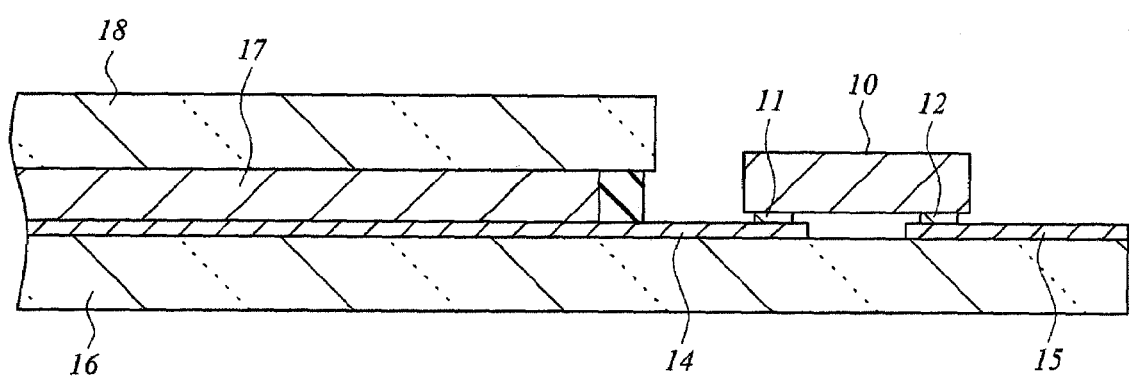
FIG. 7 is a cross sectional view showing the principal part of a method for connecting the semiconductor shown in FIG. 5 and a liquid crystal panel.

FIG. 7 is a cross sectional view showing the principal part of a method for connecting the chip 10 and a liquid crystal panel. As shown in FIG. 7, the liquid crystal panel is composed of, for example, a glass substrate 16 having pixel electrodes 14 and 15 formed on the main surface thereof, a liquid crystal layer 17, and a glass substrate 18 which is arranged opposing to the glass substrate 16 via the liquid crystal layer 17. In the first embodiment, the chip 10 is face-down bonded so that the pads 11 and 12 of the chip 10 are connected to the pixel electrodes 14 and 15 of the glass substrate 16 of the liquid crystal panel, respectively. By this means, the chip 10 is connected to the liquid crystal panel.

Figure 8:
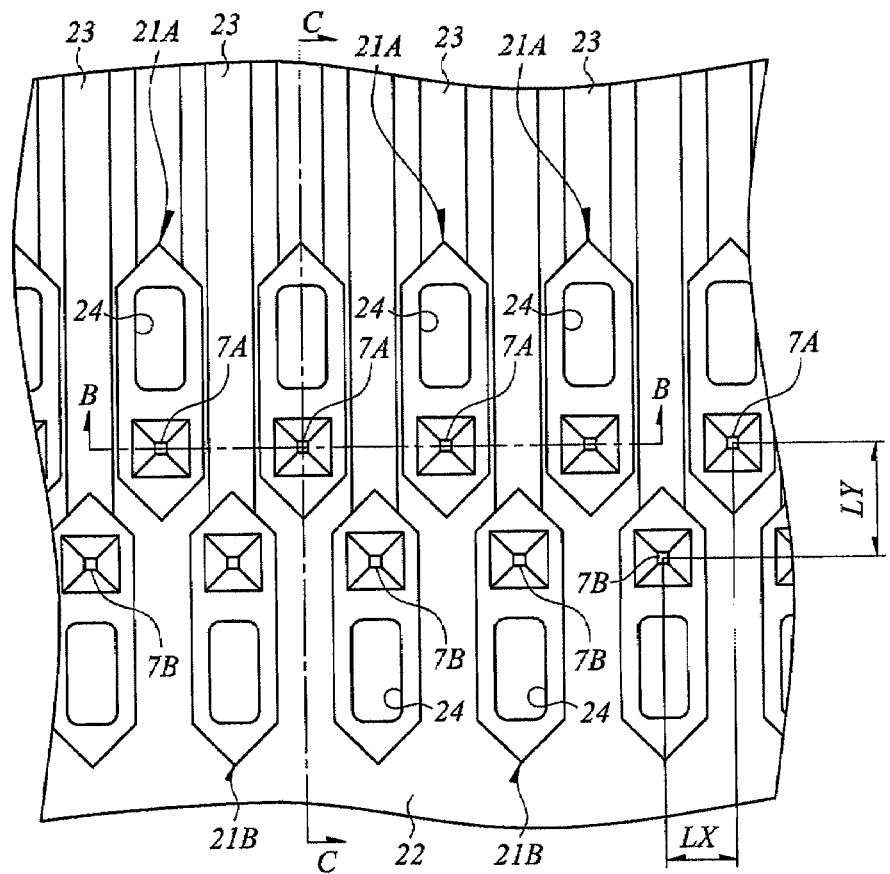
FIG. 8 is a plan view showing the principal part of a thin film sheet forming a probe card according to an embodiment of the present invention.
Figure 9:
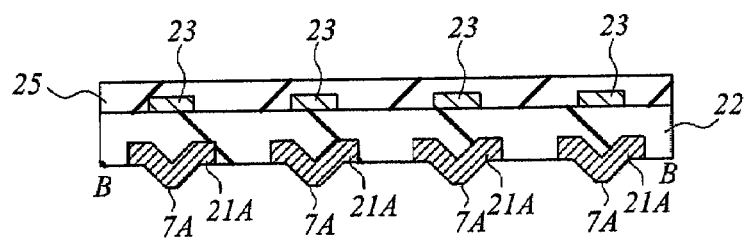
FIG. 9 is a cross sectional view taken along the line B-B in FIG. 8.
Figure 10:
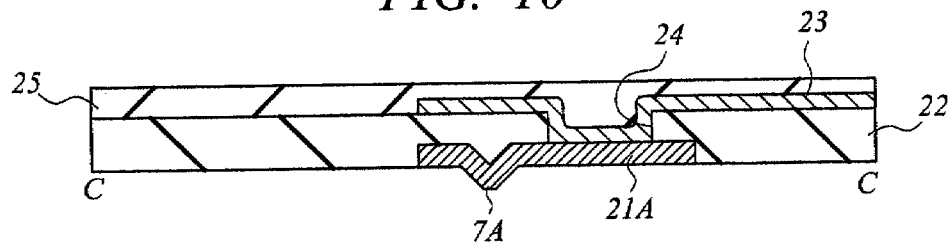
FIG. 10 is a cross sectional view taken along the line C-C in FIG. 8.
Figure 11:
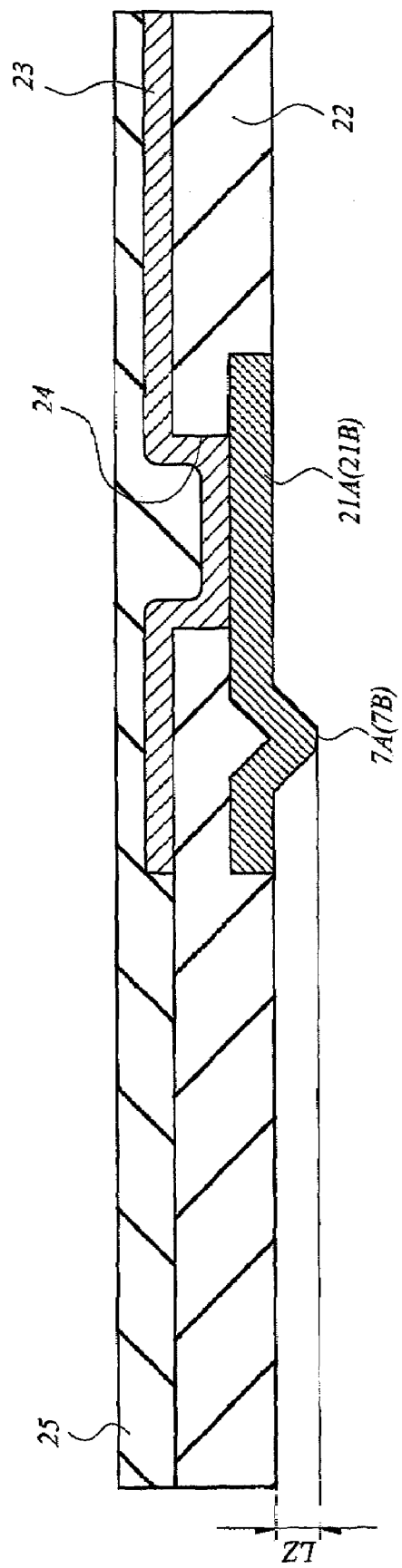
FIG. 11 is an enlarged cross sectional view showing the principal part of a thin film sheet forming a probe card according to an embodiment of the present invention.

FIG. 8 is an enlarged plan view showing the principal part of a region in which the probes 7 are formed on the lower surface of the thin film sheet 2, FIG. 9 is a cross sectional view showing the principal part taken along the line B-B in FIG. 8, and FIG. 10 is a cross sectional view showing the principal part taken along the line C-C in FIG. 8.

The probe 7 is a part of metal film 21A or 21B which is patterned into a hexagonal planar shape on the thin film sheet 2, and it is a part of the metal film 21A or 21B which has a shape of a quadrangular pyramid or a truncated quadrangular pyramid and protrudes from the lower surface of the thin film sheet 2. The probes 7 are arranged on the main surface of the thin film sheet 2 in accordance with the positions of the pads 11 and 12 formed on the above-described chip 10, and the arrangement of the probes 7 corresponding to the pads 11 is shown in FIG. 8. Probes 7A of the probes 7 correspond to the pads 11 in a line (hereinafter, referred to as a first line) which is relatively near to the periphery of the chip 10 among the pads 11 arranged in two lines, and probes 7B correspond to the pads 11 in a line (hereinafter, referred to as a second line) which is relatively distant from the periphery of the chip 10 among the pads 11 arranged in two lines. Further, a distance between the probe 7A and the probe 7B arranged most adjacently is defined by a distance LX in the lateral direction and a distance LY in the longitudinal direction of the paper on which FIG. 8 is printed, and the distance LX is about 34 μm which is half the above-described pitch LP for the pads 11 arranged adjacently. Moreover, the distance LY is about 93 μm in the present embodiment.

The metal films 21A and 21B are formed by sequentially laminating, for example, a rhodium film and a nickel film in this order from below. A polyimide film 22 is deposited on the metal films 21A and 21B, and wirings (second wirings) 23 electrically connected to the metal films 21 are formed on the polyimide film 22. The wirings 23 are in contact with the metal films 21A and 21B at the bottom of through holes 24 formed in the polyimide film 22. Further, a polyimide film 25 is formed on the polyimide film 22 and the wiring 23.

As described above, parts of the metal films 21A and 21B become the probes 7A and 7B formed in a shape of a quadrangular pyramid or a truncated quadrangular pyramid, and the through holes 24 which reach the metal films 21A and 21B are formed in the polyimide film 22. Accordingly, when a planar pattern of the metal film 21A having the probe 7A formed therein and the through hole 24 and a planar pattern of the metal film 21B having the probe 7B formed therein and the through hole 24 are arranged in the same direction, the adjacent metal film 21A and metal film 21B come in contact with each other, and there occurs a problem that independent inputs and outputs cannot be obtained from the probes 7A and 7B. Therefore, in the present embodiment, as shown in FIG. 8, the planar pattern of the metal film 21B having the probe 7B formed therein and the through hole 24 corresponds to that obtained by rotating the planar pattern of the metal film 21A having the probe 7A formed therein and the through hole 24 by 180°. By this means, the wide planar region of the metal film 21A in which the probe 7A and the through hole 24 are arranged and the wide planar region of the metal film 21B in which the probe 7B and the through hole 24 are arranged are not disposed in a straight line in the lateral direction of FIG. 8, and planar regions in a forward tapered shape of the metal films 21A and those of the metal films 21B are disposed in a straight line in the lateral direction of FIG. 8. Accordingly, it is possible to prevent the problem that the metal films 21A and 21B adjacent to each other come in contact with each other. Also, the probes 7A and 7B can be arranged at appropriate corresponding positions, even when the pads 11 (refer to FIG. 5) are arranged in a fine pitch manner.

Figure 5:
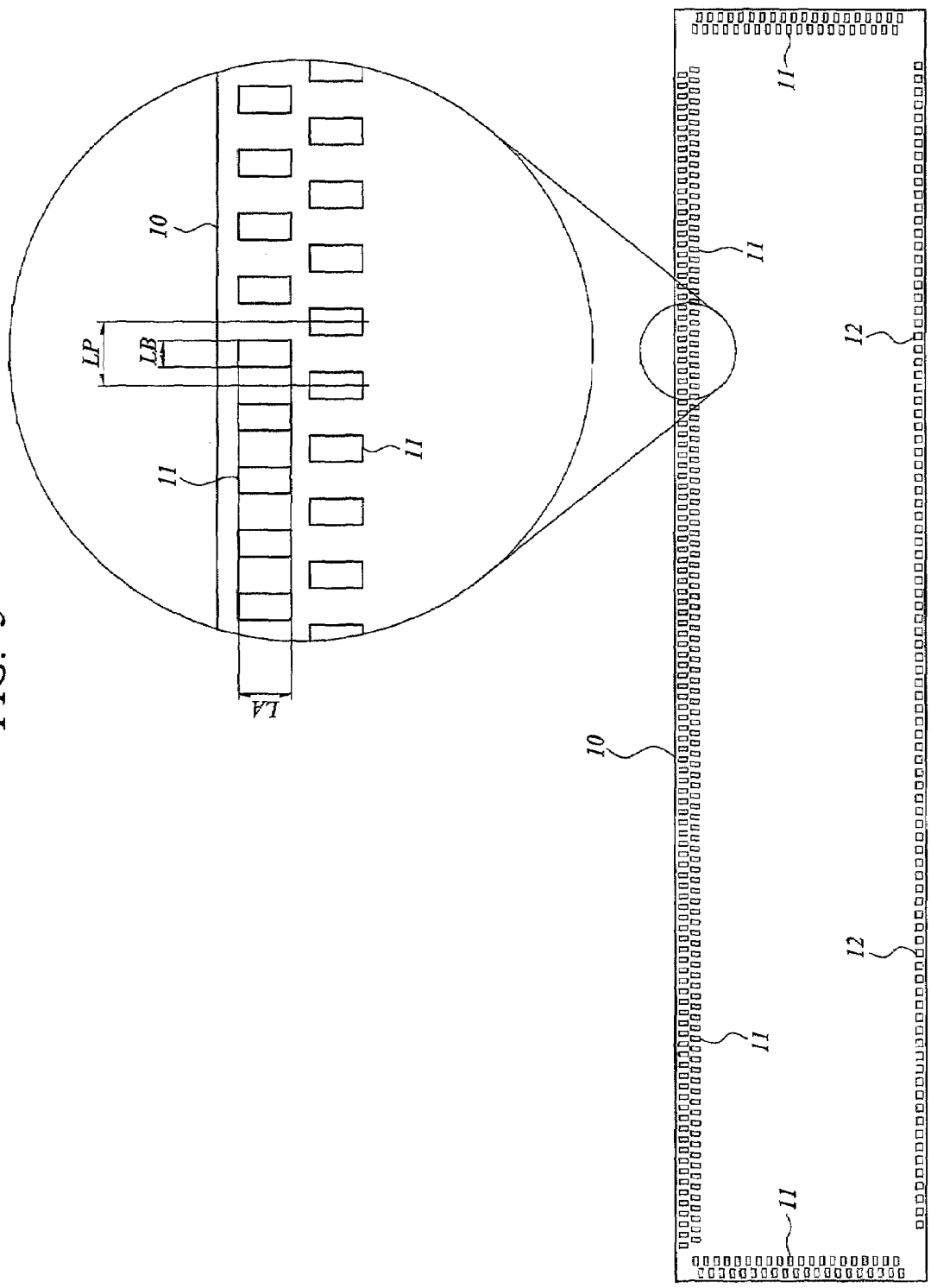
FIG. 5 is a plan view of a semiconductor chip to be an object of the probe inspection using a probe card according to an embodiment of the present invention.
Figure 12:
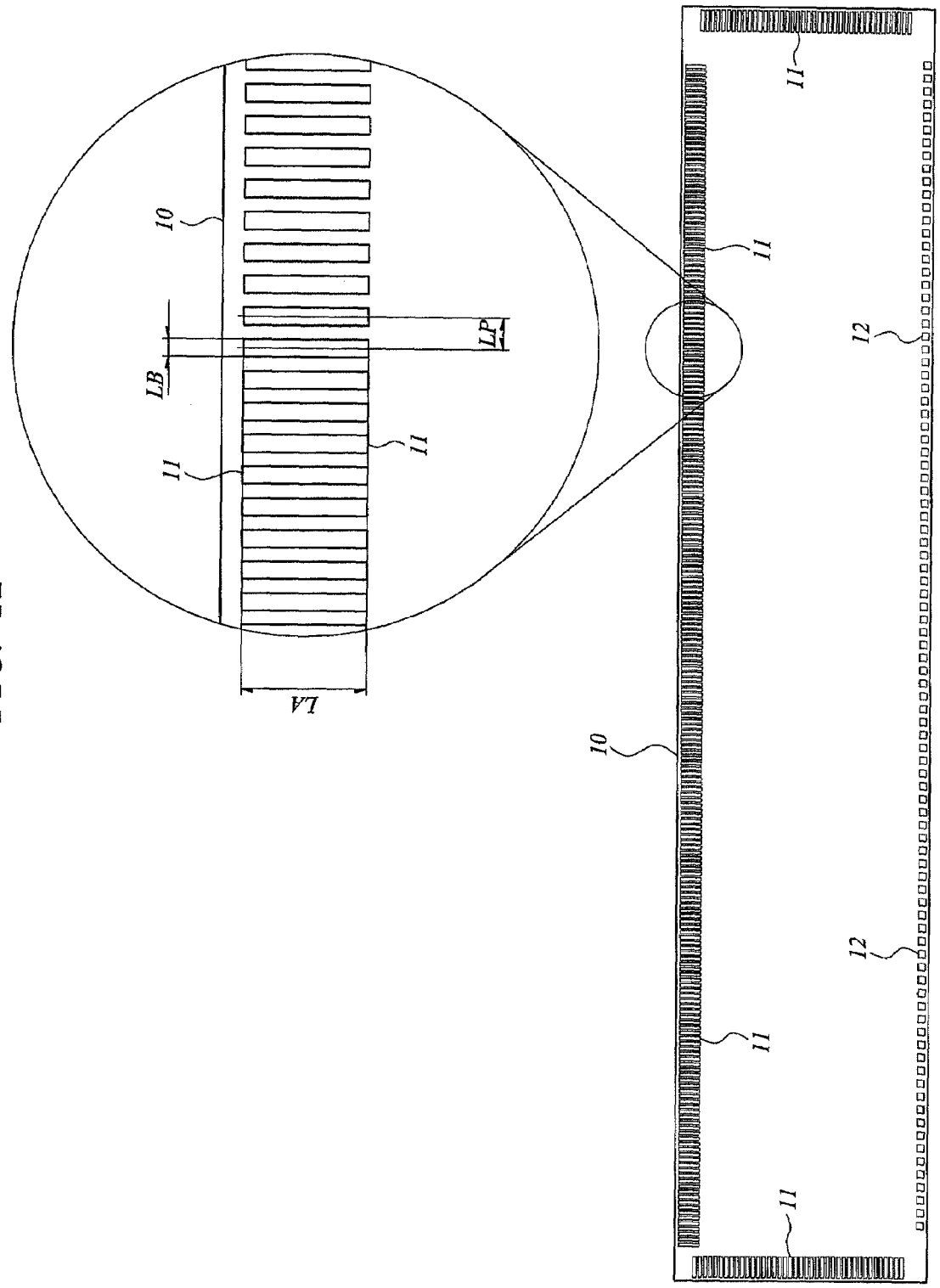
FIG. 12 is a plan view of a semiconductor chip to be an object of the probe inspection using a probe card according to an embodiment of the present invention.
Figure 13:
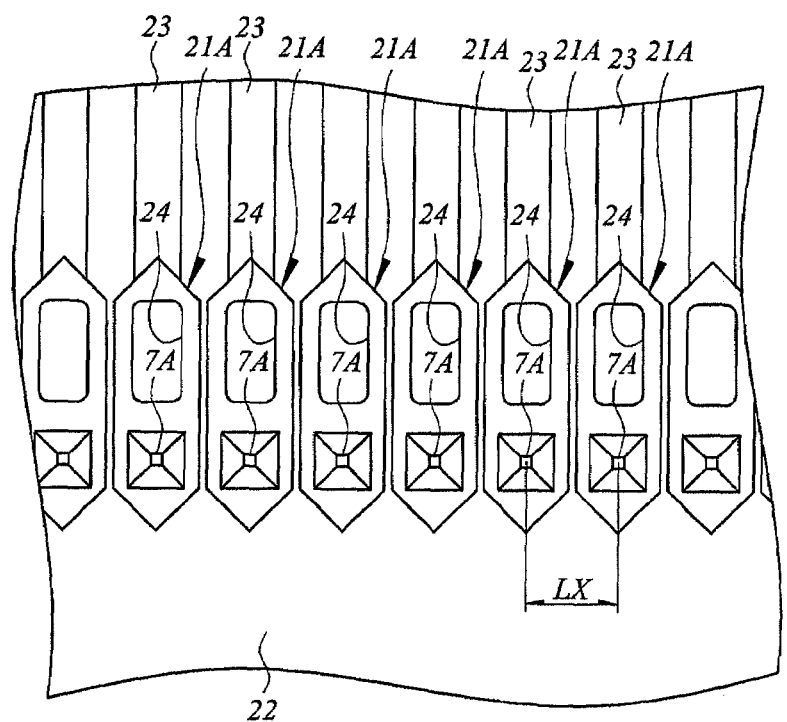
FIG. 13 is a plan view showing the principal part of a thin film sheet forming a probe card according to an embodiment of the present invention.
Figure 14:
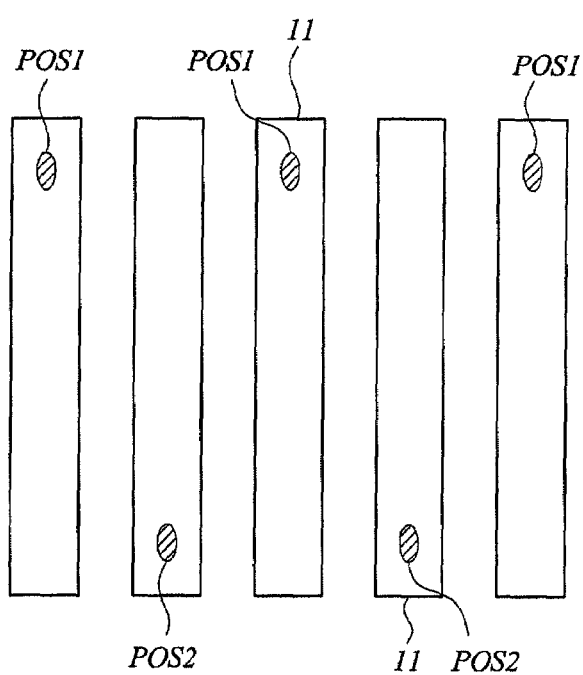
FIG. 14 is a plan view showing the positions at which probes are in contact with bump electrodes provided on a semiconductor chip to be an object of the probe inspection using a probe card according to an embodiment of the present invention.

Although the case where the pads 11 are arranged in two lines has been described with reference to FIG. 5 in the present embodiment, a chip in which the pads are arranged in one line as shown in FIG. 12 is also present. For such a chip, the thin film sheet 2 on which the wide regions of the metal films 21A are arranged in a straight line in the lateral direction of FIG. 13 is used. Also, in the case where the pads 11 are arrange in one line as described above, the length LA of the long side of the pad 11 extending in the direction intersecting with (perpendicular to) the outer periphery of the chip 10 is about 140 μm, the length LB of the short side of the pad 11 extending along the outer periphery of the chip 10 is about 19 μm, the pitch LP for the pads 11 arranged adjacent to each other is about 34 μm, and the space between the adjacent pads 11 is about 15 μm, the length of the long side of the pads 11 becomes about twice or more in comparison with that of the pads 11 shown in FIG. 5, and the center positions of the pads 11 in the direction of the short side thereof can be matched with that of the pads 11 shown in FIG. 5. Accordingly, the thin film sheet 2 described with reference to with FIG. 8 to FIG. 10 can be used. In this case, each of the probes 7A and 7B comes in contact with a corresponding one of the pads 11 at positions POS1 and POS shown in FIG. 14.

Figure 15:
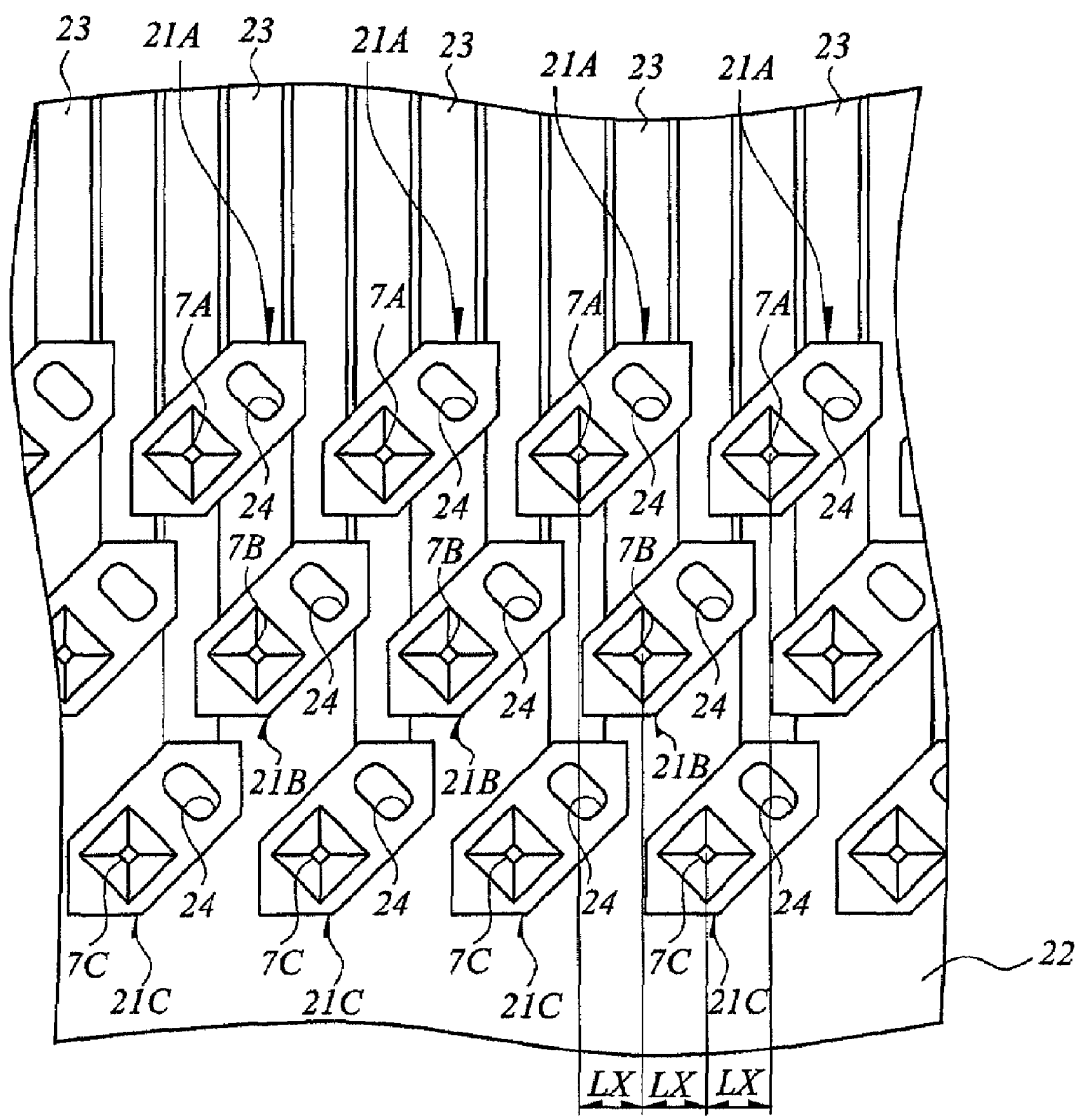
FIG. 15 is a plan view showing the principal part of a thin film sheet forming a probe card according to an embodiment of the present invention.
Figure 16:
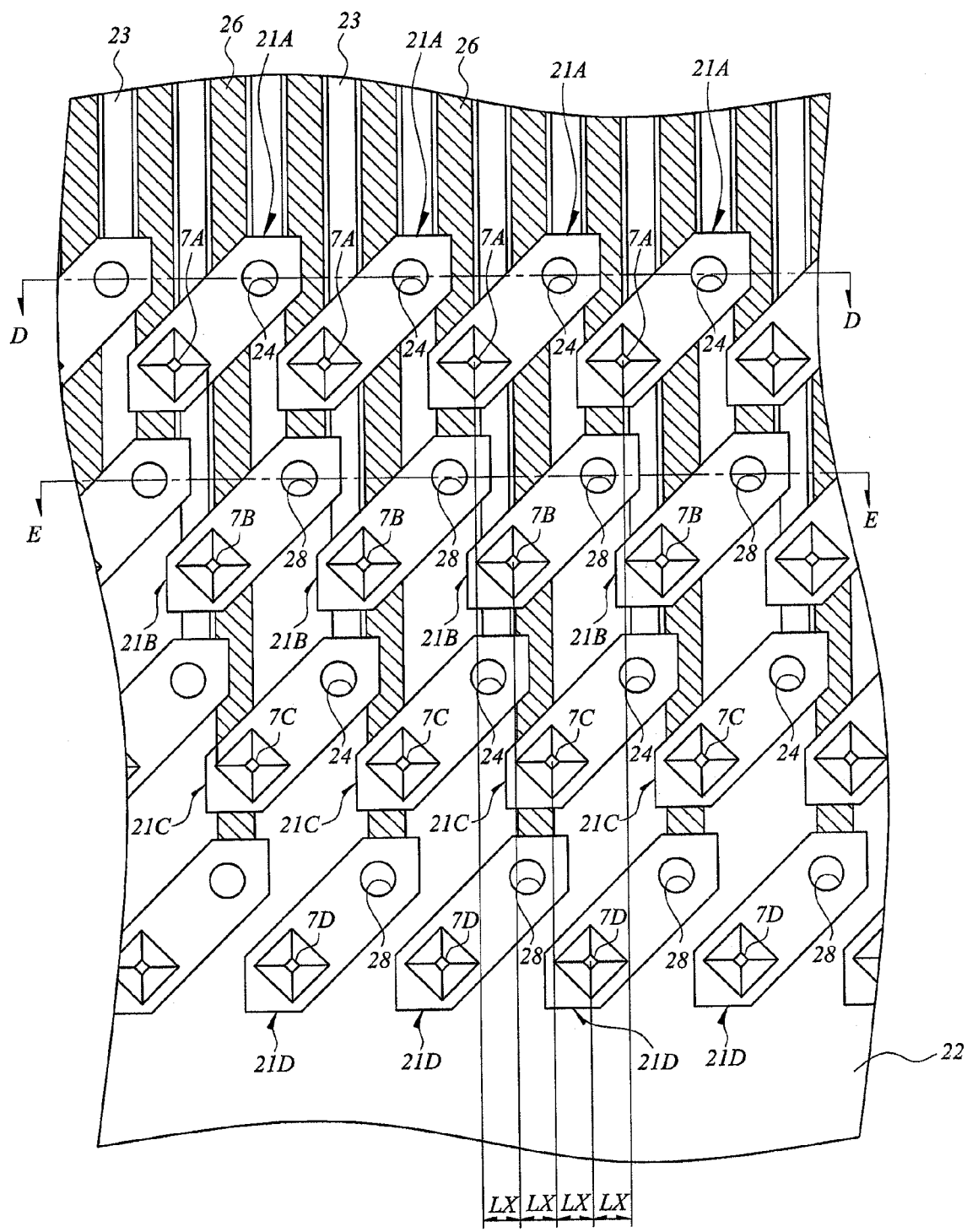
FIG. 16 is a plan view showing the principal part of a thin film sheet forming a probe card according to an embodiment of the present invention.

Alternatively, when the number of the pads 11 is further increased, the pads are arranged in three lines or more in some cases. FIG. 15 is a plan view showing the principal part of the thin film sheet 2 corresponding to the pads 11 arranged in three lines, and FIG. 16 is a plan view showing the principal part of the thin film sheet 2 corresponding to the pads 11 arranged in four lines. If the size of the chip 10 is not changed, the distance LX described with reference to FIG. 8 is further shortened as the number of lines for arranging the pads 11 is increased. Therefore, a possibility that the metal films including the above-described metal films 21A and 21B come in contact with each other is further increased. Then, if the metal films 21A, 21B, 21C, and 21D have the planar patterns obtained by rotating the planar pattern of the metal film 21A shown in FIG. 8 by 45° as shown in FIG. 15 and FIG. 16, it is possible to prevent the problem that the metal films 21A, 21B, 21C, and 21D come in contact with each other. Also, though the case where the planar pattern of the metal film 21A shown in FIG. 8 is rotated by 45° has been described here, the rotation angle is not limited to 45°, and any other rotation angles may be acceptable if the metal films 21A, 21B, 21C, and 21D may be prevented from being brought into contact with each other. In this case, a probe 7C corresponding to a pad 11 arranged on the further inner side of the chip 10 than the pad 11 corresponding to the probe 7B is formed in the metal film 21C, and a probe 7D corresponding to a pad 11 arranged on the further inner side of the chip 10 than the pad 11 corresponding to the probe 7C is formed in the metal film 21D.

Figure 17:
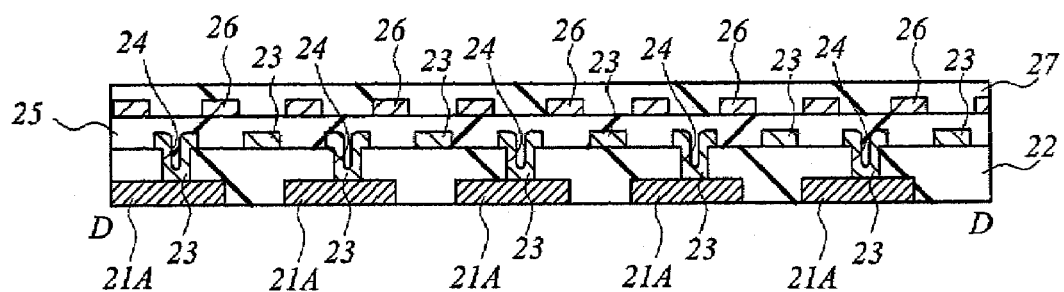
FIG. 17 is a cross sectional view taken along the line D-D in FIG. 16.
Figure 18:
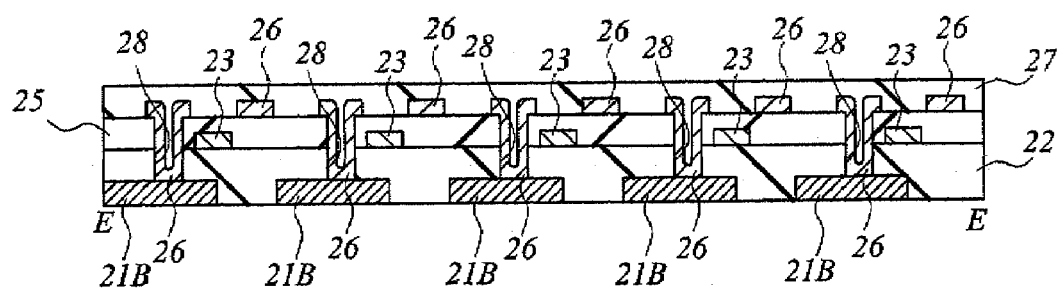
FIG. 18 is a cross sectional view taken along the line E-E in FIG. 16.

Here, FIG. 17 is a cross sectional view showing the principal part taken along the line D-D in FIG. 16, and FIG. 18 is a cross sectional view showing the principal part taken along the line E-E in FIG. 16. When the metal films 21A to 21D having the probes 7A to 7D corresponding to the pads 11 arranged in four lines are arranged as shown in FIG. 16, it is difficult to form all of the wirings electrically connected from the upper layer to each of the metal films 21A to 21D in the same wiring layer. This is because, when the above-described distance LX is shortened, the possibility that the metal films 21A to 21D are in contact with each other is increased and at the same time, the possibility that the wirings electrically connected to each of the metal films 21A to 21D are in contact with each other is also increased. Accordingly, in the present embodiment, the wirings are formed of two wiring layers (wirings 23 and 26) as shown in FIG. 17 and FIG. 18. In this case, a polyimide film 27 is formed on the wirings 26 and the polyimide film 25. The wirings 23 in the relatively lower layer come in contact with the metal films 21A and 21C at the bottom of the through holes 24 formed in the polyimide film 22, and the wirings 26 in the relatively upper layer come in contact with the metal films 21B and 21D at the bottom of the through holes 28 formed in the polyimide films 22 and 25. In this manner, since a larger space between the adjacent wirings 23 or that between the adjacent wirings 26 can be ensured in the same wiring layer, it is possible to prevent the problem that the adjacent metal films 23 or the adjacent metal films 26 come in contact with each other in the respective wiring layers. Moreover, when the pads 11 are arranged in five lines or more, the number of the probes corresponding to the pads is increased, and the above-described distance LX is further shortened, the space between the wirings can be enlarged by increasing the number of the wiring layers.

Next, the structure of the thin film sheet 2 according to the present embodiment will be described together with the manufacturing process thereof with reference to FIG. 19 to FIG. 26. FIG. 19 to FIG. 26 are cross sectional views showing the principal part of a process for manufacturing the thin film sheet 2 having the probes 7A and 7B corresponding to the pads 11 arranged in two lines (refer to FIG. 7) described with reference to FIG. 8 to FIG. 11. Note that the structure of a thin film sheet and a process for manufacturing the thin film sheet and the structure of a probe similar to the above-described probes 7 (probes 7A to 7D) and a process for manufacturing the probe have been disclosed in Japanese Patent Application No. 2003-75429, Japanese Patent Application No. 2003-371515, Japanese Patent Application No. 2003-372323, and Japanese Patent Application No. 2004-115048.

Figure 19:
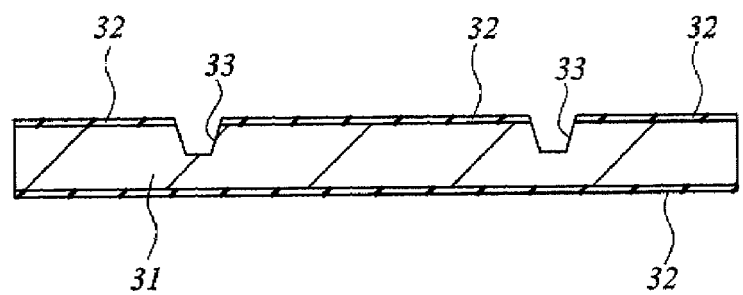
FIG. 19 is a cross sectional view showing the principal part for describing manufacturing process of a thin film sheet forming a probe card according to an embodiment of the present invention.

First, a wafer 31 made of silicon and having a thickness of about 0.2 mm to about 0.6 mm is prepared, and a silicon oxide film 32 with a film thickness of about 0.5 μm is formed on the both surfaces of the wafer 31 by a thermal oxidation method as shown in FIG. 19. Subsequently, the silicon oxide film 32 on the main surface side of the wafer 31 is etched with using a photoresist film as a mask to form openings which reach the wafer 31 in the silicon oxide film 32 on the main surface side of the wafer 31. Then, the wafer 31 is anisotropically etched by strong alkaline solution (for example, potassium hydroxide solution) with using the remaining silicon oxide film 32 as a mask, thereby forming holes 33 with a shape of a quadrangular pyramid or a truncated quadrangular pyramid which are bounded by a (111) plane on the main surface of the wafer 31.

Figure 20:
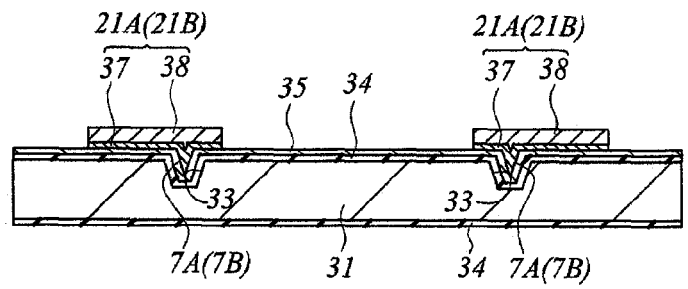
FIG. 20 is a cross sectional view showing the principal part in the manufacturing process of the thin film sheet subsequent to FIG. 19.

Next, as shown in FIG. 20, the silicon oxide film 32 used as the mask in forming the above-described holes 33 is removed by wet etching using mixed solution of hydrofluoric acid and ammonium fluoride. Subsequently, a silicon oxide film 34 with a film thickness of about 0.5 μm is formed on the whole surface of the wafer 31 including the inside of the holes 33 by the thermal oxidation process to the wafer 31. Then, a conductive film 35 is deposited on the main surface of the wafer 31 including the inside of the holes 33. This conductive film 35 can be formed by sequentially depositing a chromium film with a film thickness of about 0.1 μm and a copper film with a film thickness of about 1 μm by a sputtering method or a vacuum evaporation method. Subsequently, after a photoresist film is formed on the conductive film 35, the photoresist film in the regions where the metal films 21A and 21B (refer to FIG. 8 to FIG. 10) are to be formed in the later steps is removed by the photolithography technology, thereby forming the openings.

Next, a conductive film 37 with high hardness and a conductive film 38 are sequentially deposited on the conductive film 35 exposed at the bottom of the opening in the photoresist film by the electroplating method using the conductive film 35 as an electrode. In the present embodiment, the conductive film 37 is a rhodium film and the conductive film 38 is a nickel film. Through the processes described above, the above-described metal films 21A and 21B can be formed from the conductive films 37 and 38. Also, the conductive films 37 and 38 in the holes 33 correspond to the above-described probes 7A and 7B. Although the conductive film 35 is removed in the later steps, the steps will be described later.

In the metal films 21A and 21B, the conductive film 37 formed of a rhodium film becomes the surface thereof when the above-described probes 7A and 7B are formed in the later steps, and the conductive film 37 comes in direct contact with the pad 11. Accordingly, a material with high hardness and excellent in abrasion resistance is preferably selected for the conductive film 37. Also, since the conductive film 37 is in direct contact with the pad 11, when waste of the pad 11 scraped by the probes 7A and 7B adheres to the conductive film 37, a cleaning process for removing the waste is required, and the probe inspection process is delayed. Accordingly, a material to which a material of the pad 11 does not easily adhere is preferably selected for the conductive film 37. Thus, the rhodium film which satisfies the above-described conditions is selected for the conductive film 37 in the present embodiment. As a result, the cleaning process can be eliminated.

Figure 21:
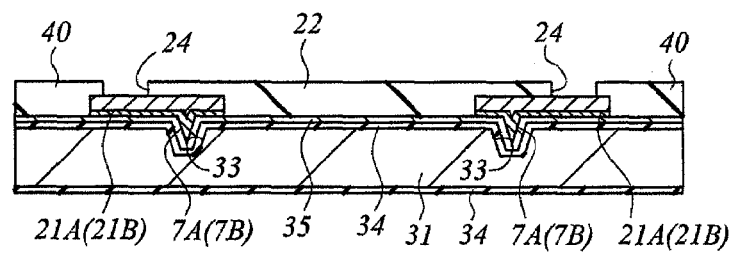
FIG. 21 is a cross sectional view showing the principal part in the manufacturing process of the thin film sheet subsequent to FIG. 20.

Next, after removing the photoresist film used in forming the above-described metal films 21A and 21B (conductive films 37 and 38), the polyimide film 22 (refer to FIG. 9 and FIG. 10) is formed so as to cover the metal films 21A and 21B and the conductive film 35 as shown in FIG. 21. Subsequently, the above-described through holes 24 which reach the metal films 21A and 21B are formed in the polyimide film 22. The through hole 24 can be formed by drilling process using a laser or by dry etching using an aluminum film as a mask.

Figure 22:
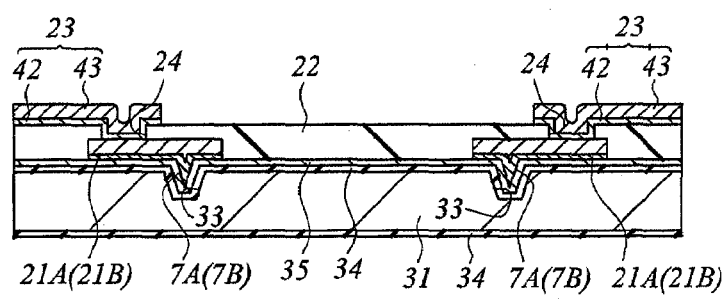
FIG. 22 is a cross sectional view showing the principal part in the manufacturing process of the thin film sheet subsequent to FIG. 21.

Next, as shown in FIG. 22, a conductive film 42 is formed on the polyimide film 22 including the inside of the through holes 24. This conductive film 42 can be formed by sequentially depositing a chromium film with a film thickness of about 0.1 μm and a copper film with a film thickness of about 1 μm by a sputtering method or a vacuum evaporation method. Subsequently, after forming a photoresist film on the conductive film 42, the photoresist film is patterned by the photolithography technology, thereby forming openings which reach the conductive film 42 in the photoresist film. Then, a conductive film 43 is deposited on the conductive film 42 in the openings by a plating method. In the present embodiment, for example, a copper film or a laminated film obtained by sequentially depositing a copper film and a nickel film in this order from below can be used as the conductive film 43.

Next, after removing the photoresist film, the conductive film 42 is etched with using the conductive film 43 as a mask, thereby forming the wirings 23 formed of the conductive films 42 and 43. The wirings 23 can be electrically connected to the metal films 21A and 21B at the bottom of the through holes 24.

Figure 23:
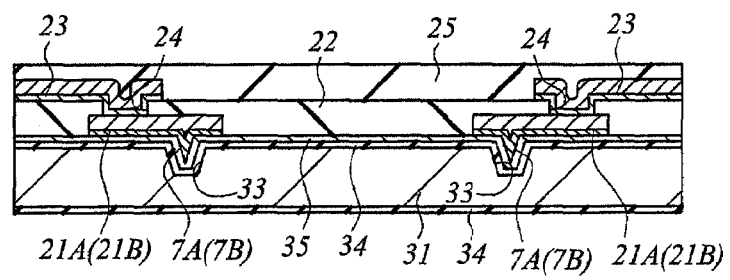
FIG. 23 is a cross sectional view showing the principal part in the manufacturing process of the thin film sheet subsequent to FIG. 22.
Figure 24:
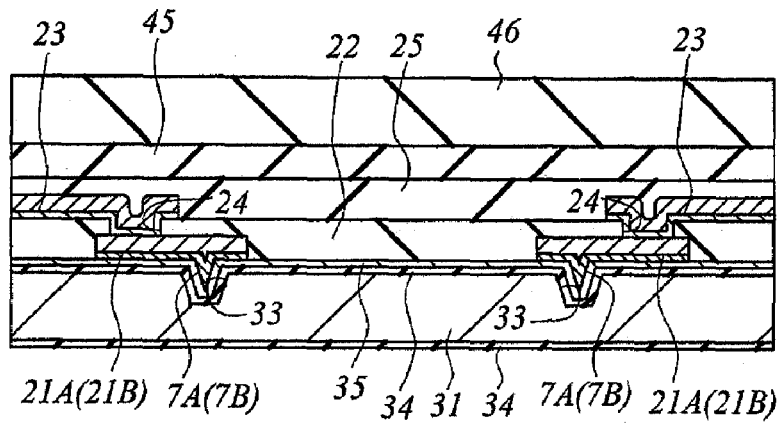
FIG. 24 is a cross sectional view showing the principal part in the manufacturing process of the thin film sheet subsequent to FIG. 23.

Next, as shown in FIG. 23, the above-described polyimide film 25 is deposited on the main surface of the wafer 31. Subsequently, as shown in FIG. 24, a polyimide sheet 45 with a thickness of about 12.5 μm is formed on the upper surface of the polyimide film 25. Then, an elastomer 46 with a thickness of about 50 μm is formed on the upper surface of the polyimide sheet 45. In the present embodiment, as a method for forming the elastomer 46, a method in which a liquid elastomer is printed or coated with a dispenser or a method in which a sheet-type elastomer is disposed can be used. The elastomer 46 absorbs the variation in height of the tips of the probes 7A and 7B by a local deformation thereof while reducing the shock when the tips of a number of the probes 7A and 7B come in contact with the pads 11, and it realizes the contact between the probes 7A and 7B and the pads 11 by the uniform indentation in accordance with the variations in height of the pads 11.

Figure 25:
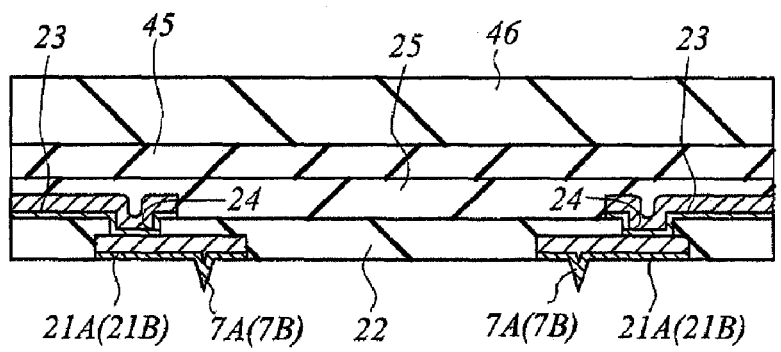
FIG. 25 is a cross sectional view showing the principal part in the manufacturing process of the thin film sheet subsequent to FIG. 24.

Next, as shown in FIG. 25, the silicon oxide film 34 on the rear surface of the wafer 31 is removed by, for example, etching using a mixed solution of hydrofluoric acid and ammonium fluoride. Subsequently, the wafer 31 which is a mold for forming the thin film sheet 2 is removed by etching using strong alkaline solution (for example, a potassium hydroxide solution). Then, the silicon oxide film 34 and the conductive film 35 are sequentially removed by etching. At this time, the silicon oxide film 34 is etched using mixed solution of hydrofluoric acid and ammonium fluoride, the chromium film included in the conductive film 35 is etched using potassium permanganate solution, and the copper film included in the conductive film 35 is etched using alkaline copper etching solution. Through the process described above, the rhodium film which is the conductive film 37 (refer to FIG. 20) forming the probes 7A and 7B appears on the surfaces of the probes 7A and 7B. As described above, since the rhodium film is formed on the surface of the probes 7A and 7B, Au and others which are the material of the pads 11 with which the probes 7A and 7B are contacted do not easily adhered to the probes 7A and 7B, and the probes have higher hardness than that of Ni and do not easily oxidized. Accordingly, stable contact resistance can be realized.

Figure 26:
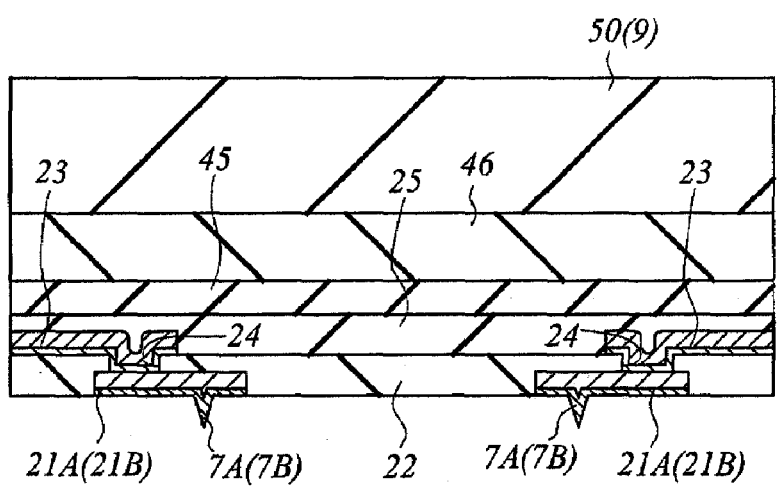
FIG. 26 is a cross sectional view showing the principal part in the manufacturing process of the thin film sheet subsequent to FIG. 25.

Next, as shown in FIG. 26, a pressing tool 50 (pressing tool 9) made of, for example, 42 alloy is bonded onto the elastomer 46, thereby completing the manufacture of the thin film sheet 2 according to the present embodiment.

By repeating the steps for forming the above-described through holes 24, the wiring 23 and the polyimide film 25, the number of layers for the wiring can be further increased according to need.

Figure 27:
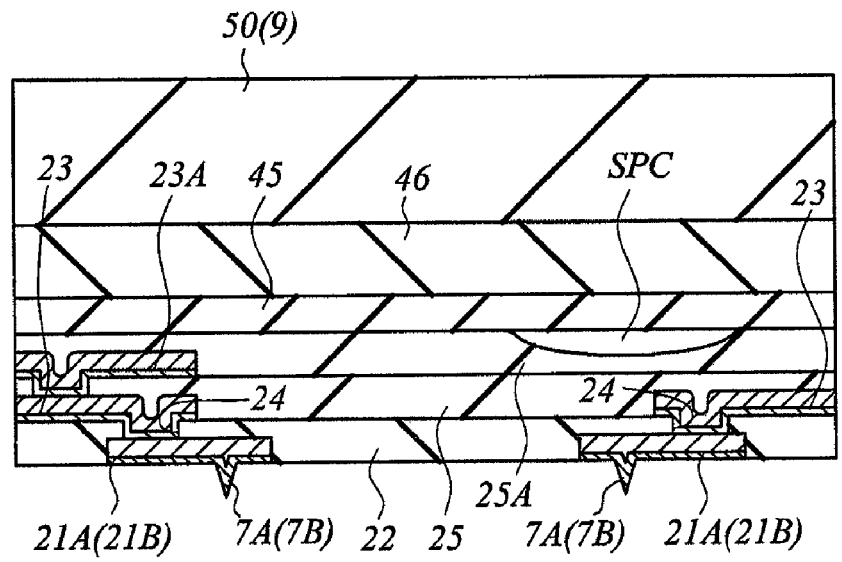
FIG. 27 is a cross sectional view for describing problems caused during the process of forming a thin film sheet forming a probe card.
Figure 28:
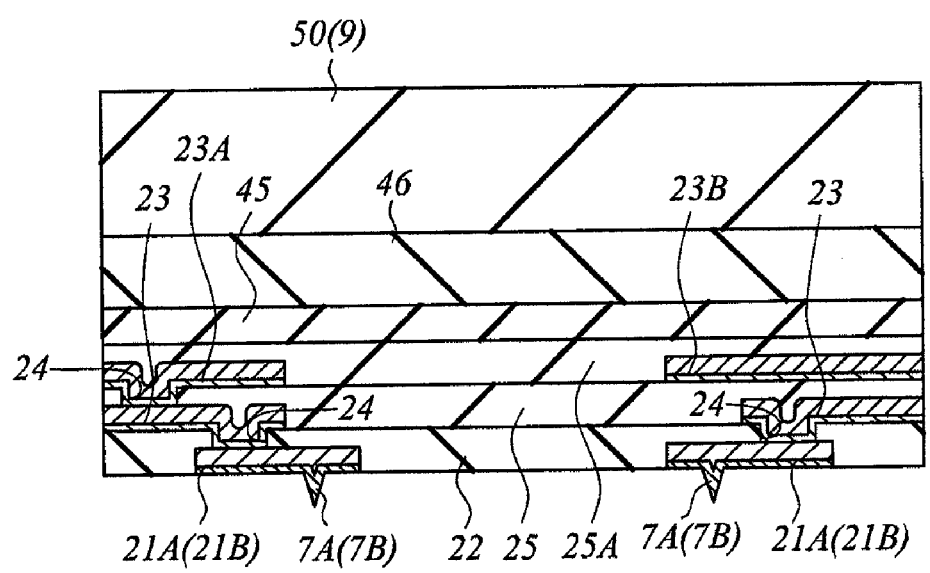
FIG. 28 is a cross sectional view showing the principal part of a thin film sheet forming a probe card according to an embodiment of the present invention.

Incidentally, when the number of the wiring layers is increased in the thin film sheet 2, the wiring 23A (fourth wiring) as the upper layer is formed on the wiring 23 as the lower layer in one location, and the wiring 23A is not formed on the wiring 23 in another location as shown in FIG. 27. In such a case, since the polyimide film 25A is recessed due to the absence of the wiring 23A in the location where the wiring 23A is not formed and the upper surface of the polyimide film 25A on the wiring 23 falls down, there is a possibility that a gap SPC is formed between the polyimide film 25A and the polyimide sheet 45. When the gap SPC is formed, the gap SPC absorbs a pressing force when the pressing force is applied by the pressing tool (pressing mechanism) 50 so that the probes 7A and 7B are in contact with the pads 11 and 12 in the chip 10 (refer to FIG. 5 and to FIG. 12) in the probe inspection. Accordingly, there occurs a problem that the probes 7A and 7B cannot be surely in contact with the pads 11 and 12.

Therefore, in the present embodiment, a wiring (fifth wiring) 23B which is not electrically connected to the underlying wiring 23 is formed even in the location where the wiring 23A is not formed so as to prevent the above-described recession from being formed. By this means, it is possible to prevent the gap SPC from being formed. In other words, the probes 7A and 7B can surely be in contact with the pads 11 and 12 in the probe inspection.

Figure 29:
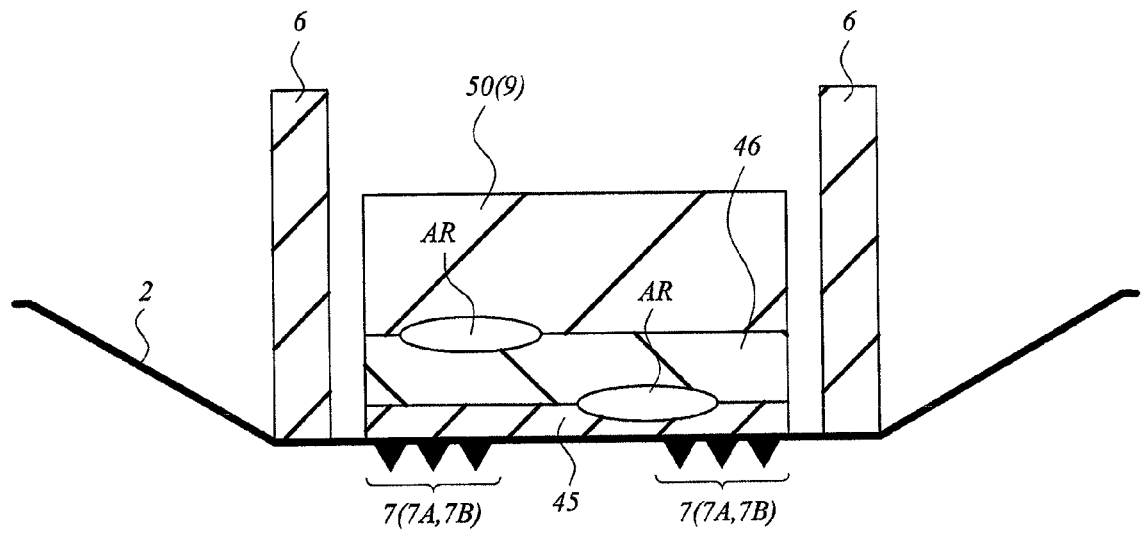
FIG. 29 is a cross sectional view for describing problems caused during the process of forming a probe card.

Moreover, as shown in FIG. 29, when the thin film sheet 2 formed through the above-described steps is assembled to a probe card, there is a possibility that air AR is trapped at each interface when the polyimide sheet 45 is disposed on the thin film sheet 2 and when the elastomer 46 is formed. In the case where the air AR is trapped, the air AR expands in a high-temperature atmosphere in the probe inspection, and the expanded air AR absorbs the pressing force from the pressing tool 50. Accordingly, there occurs a problem that the probes 7 (7A and 7B) cannot surely be in contact with the pads 11 and 12. Here, for easier understanding of the relation between the structure of the probe card and the problem of the trapped air, the polyimide sheet 45, the elastomer 46, and the pressing tool 50 (pressing tool 9) are shown independently from the thin film sheet 2 in FIG. 29.

Figure 30:
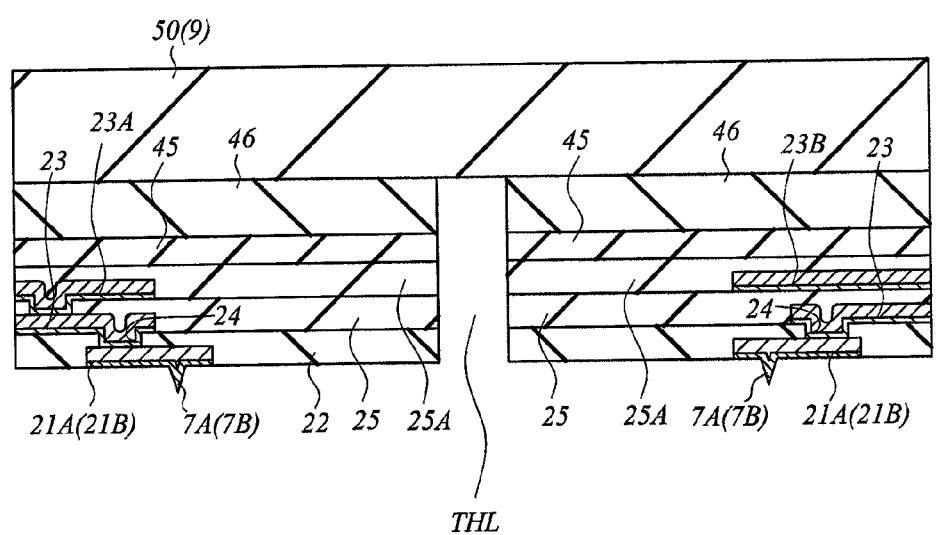
FIG. 30 is a cross sectional view showing the principal part of the manufacturing process of a thin film sheet forming a probe card according to an embodiment of the present invention.

Therefore, in the present embodiment, when the thin film sheet 2 is formed, a hole THL with a diameter of about 100 μm to 150 μm which extends from the probe surface (the surface on which the probes 7 (7A and 7B) are formed) of the thin film sheet 2 to the pressing tool 50 (pressing tool 9) is formed as shown in FIG. 30 at a position away from the portions where the probes 7 (7A and 7B), the metal films 21A and 21B, and the wirings 23, 23A, and 23B are formed. The hole THL can be formed by, for example, drilling using a laser. If the hole THL is formed as described above, the air AR can be removed through the hole THL even when the air AR is trapped in the thin film sheet 2. More specifically, the probes 7 (7A and 7B) can surely be in contact with the pads 11 and 12 in the probe inspection.

Figure 31:
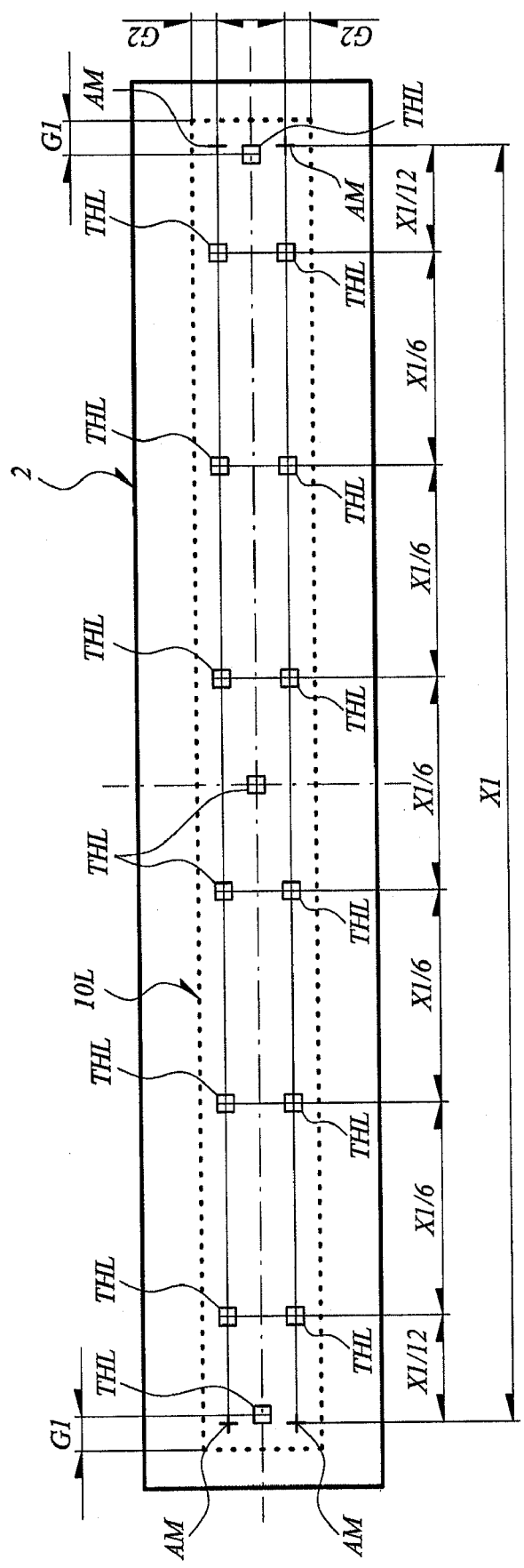
FIG. 31 is a plan view for describing positions at which holes for removing air in a thin film sheet are formed in the thin film sheet forming a probe card according to an embodiment of the present invention.

FIG. 31 is a plan view showing the principal part for describing the forming position of the above-described hole THL in the thin film sheet 2. A region defined by a dotted line in FIG. 31 is a region 10A corresponding to the outline of the chip 10. Further, alignment marks AM are used for the alignment in assembling the probe card and the alignment of the chip 10 in the probe inspection. As described above, the hole THL is formed at the position away from the portions where the probes 7 (7A and 7B), the metal films 21A and 21B, and the wirings 23, 23A, and 23B are formed. Also, since the probes 7 (7A and 7B), the metal films 21A and 21B, and the wirings 23, 23A, and 23B are formed in the outer peripheral region of the region 10A represented by G1 (in the lateral direction of FIG. 31) and G2 (in the longitudinal direction of FIG. 31) in FIG. 31, the holes are formed on the internal side of the region represented by the above G1 and G2. In the present embodiment, when a distance between two alignment marks AM in the lateral direction of FIG. 31 is assumed to be X1, the holes THL are arranged at intervals of X1/12, X1/6, X1/6, X1/6, X1/6, X1/6, and X1/12 between the two alignment marks AM. Further, the hole THL can also be disposed at the center of the region 10A.

Figure 32:
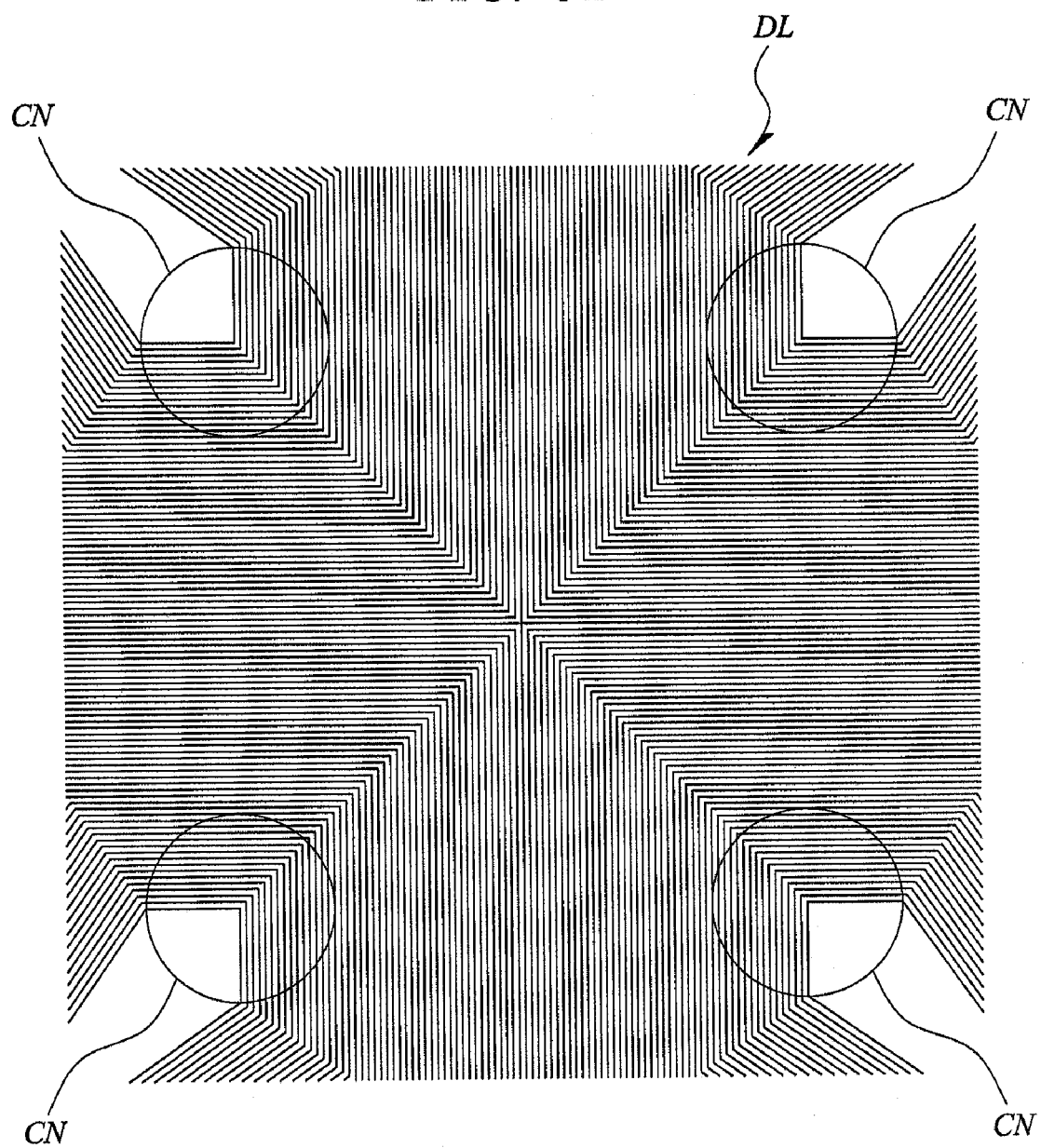
FIG. 32 is a plan view for describing dummy wirings provided on a thin film sheet forming a probe card according to an embodiment of the present invention.
Figure 33:
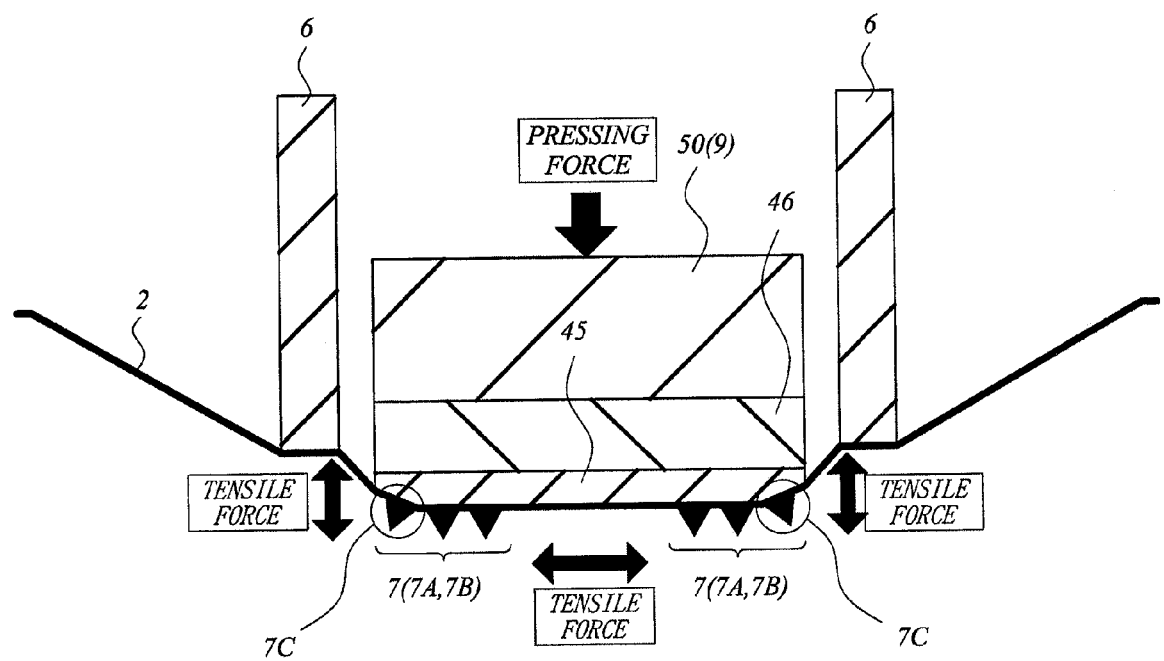
FIG. 33 is a cross sectional view for describing problems caused when using a probe card provided with a thin film sheet.

Incidentally, in the thin film sheet 2 according to the present embodiment, for the purpose of surely contacting the probes 7 (7A and 7B) with the pads 11 and 12 in the probe inspection, dummy wirings DL are formed on the whole surface of the thin film sheet 2 as shown in FIG. 32 in order to equalize the stiffness on the whole surface of the thin film sheet 2. The dummy wirings DL are not electrically connected to the wirings and the probes 7 (7A and 7B) related with the probe inspection. When the number of test pads (pads 11 and 12) formed on the surface of the chip 10 is increased under the circumstances where the dummy wirings DL are formed, the number of wirings formed in the thin film sheet 2 is also increased, and the stiffness of the thin film sheet 2 is further increased. Accordingly, as shown in FIG. 33, the tensile force applied to the thin film sheet 2 is increased, and probes 7C which are near to the bonding ring 6 among the probes 7 are pulled in a direction toward the pressing tool 50 (pressing tool 9) (upward direction in FIG. 33) by the pressing of the pressing tool 50 (pressing tool 9). Accordingly, there occurs a problem that the probes 7C cannot surely be in contact with the pads 11 and 12. Since corner portions of the polyimide sheet 45 are contacted in the regions CN shown in FIG. 32, a particularly large tensile force is applied to the regions, and the probes 7C in the regions CN are pulled especially in the direction toward the pressing tool 50 (pressing tool 9) (in the upward direction of FIG. 33).

Figure 34:
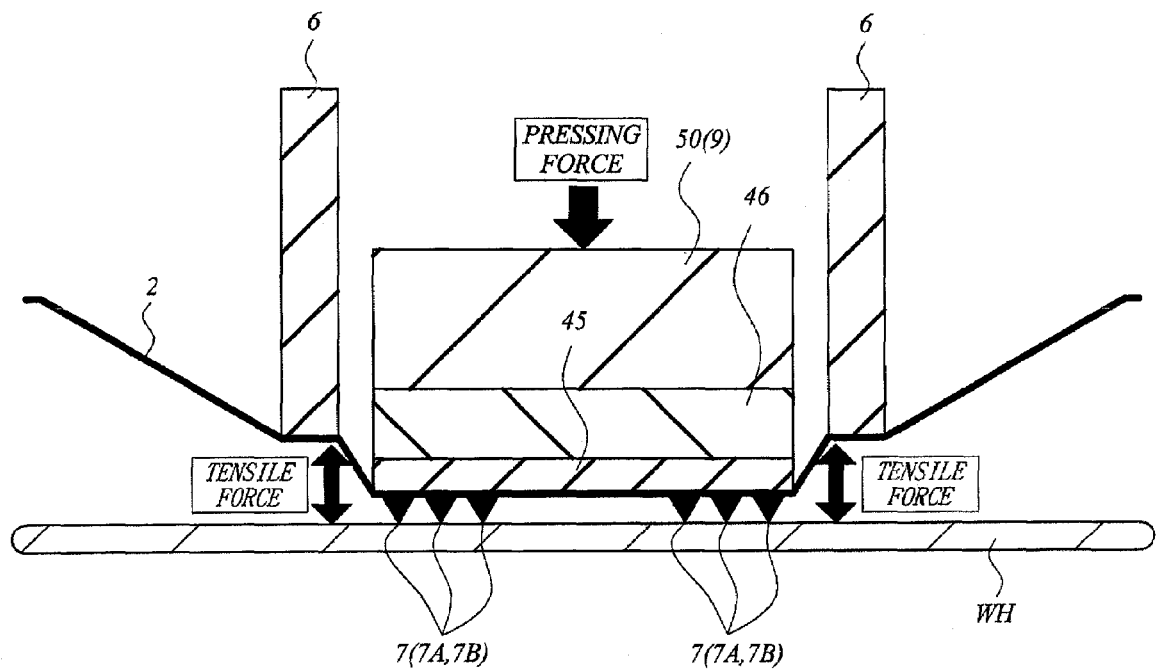
FIG. 34 is a cross sectional view for describing a method for reducing a tensile force applied to a thin film sheet forming a probe card according to an embodiment of the present invention.

Therefore, in the present embodiment, before the probe card is actually used for the probe inspection, a strong tensile force (first force) is applied to the thin film sheet 2 under a high temperature (first temperature) atmosphere so as to reduce a tensile force of the thin film sheet 2 itself. For example, as shown in FIG. 34, under a high temperature atmosphere at 100° C. or more, the pressing tool 50 (pressing tool 9) is extruded more than the adjusting amount for maintaining the probe inspection, thereby applying a tensile force stronger than that in the probe inspection to the thin film sheet 2. In this state, the probes 7 (7A and 7B) are in contact with the wafer WH and then are left for several hours to reduce the tensile force of the thin film sheet 2 itself. At this time, in order to prevent the excessive reduction of the tensile force of the thin film sheet 2 itself, the tensile force is reduced to a desired tensile force (first tensile force) not at a time but through several stages, in which the tensile force of the thin film sheet 2 itself is measured at every stage, and the tensile force is brought close to a target tensile force little by little. By this means, it is possible to prevent the probes 7 (7A and 7B) from being pulled in the direction toward the pressing tool 50 (pressing tool 9) (in the upward direction of FIG. 33) due to the tensile force of the thin film sheet 2 itself in the probe inspection, and the problem that the probes 7 are not in contact with the pads 11 and 12 can be prevented.

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 35:
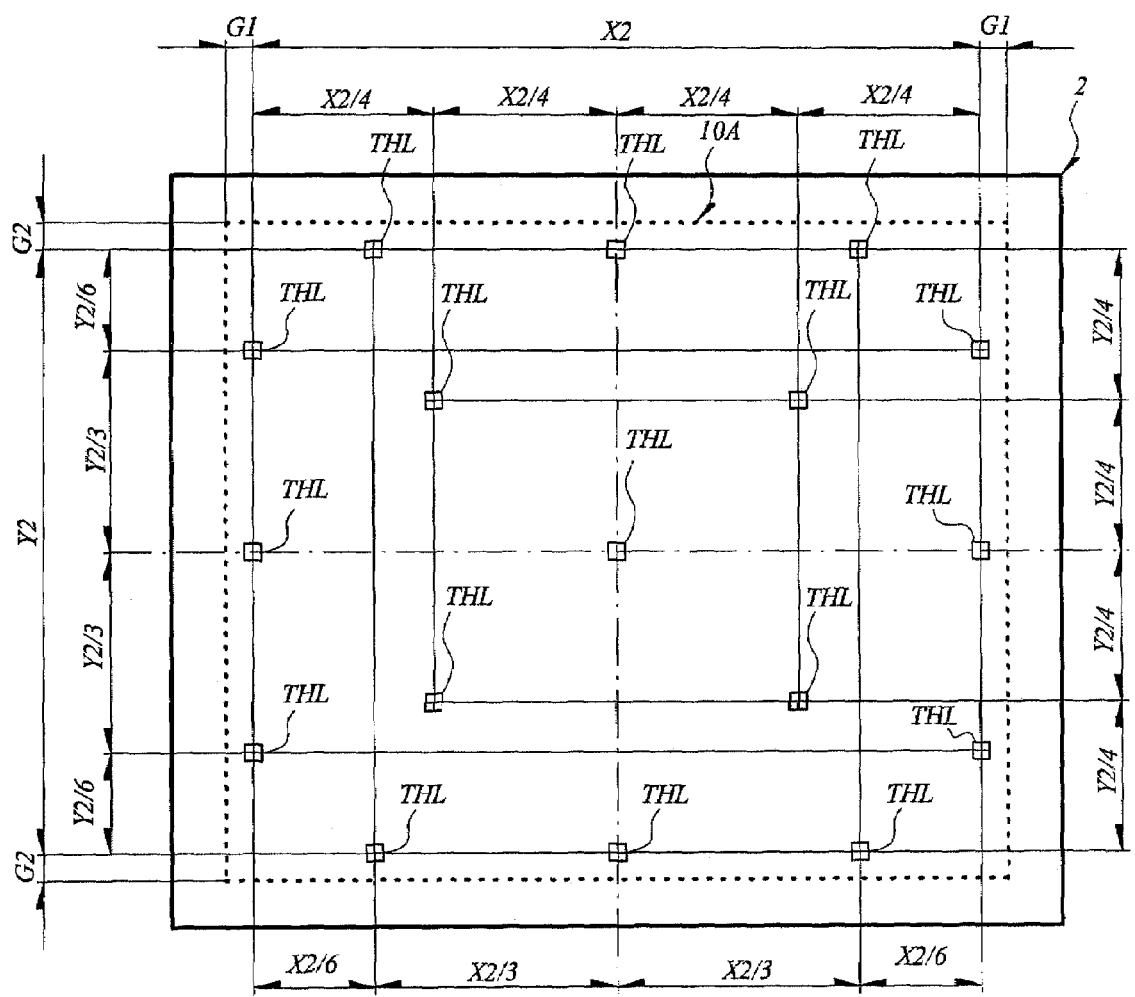
FIG. 35 is a plan view for describing positions at which holes for removing air in a thin film sheet are formed in the thin film sheet forming a probe card according to an embodiment of the present invention.

In the above-described embodiments, the case where an object of the probe inspection using the probe card having the thin film sheet is a chip having an LCD driver formed thereon has been described. However, the probe inspection can be performed to a chip having a logic circuit formed thereon. As a result, if the external planar shape of the chip approaches a square one in comparison with the case of the LCD driver, for example, the holes THL formed in the thin film sheet can be formed at positions shown in FIG. 35. More specifically, if a length obtained by subtracting the lengths represented by G1 at the external ends of the region 10A from the lateral length of the region 10A corresponding to the outline of the chip is defined as X2 and a length obtained by subtracting the lengths represented by G2 at the external ends of the region 10A from the longitudinal length of the region 10A is defined as Y2, the holes THL arranged relatively in the outer periphery on the plane are disposed at intervals of X2/6, X2/3, X2/3, and X2/6 in the lateral direction of FIG. 35 and at intervals of Y2/6, Y2/3, Y2/3, and Y2/6 in the longitudinal direction of FIG. 35. Also, the holes THL arranged in the relatively inner periphery on the plane are disposed at intervals of X2/4, X2/4, X2/4, and X2/4 in the lateral direction of FIG. 35 and at intervals of Y2/4, Y2/4, Y2/4, and Y2/4 in the longitudinal direction of FIG. 35. Further, the hole THL can be disposed at the center of the region 10A.

INDUSTRIAL APPLICABILITY

The manufacturing method of a semiconductor integrated circuit device according to the present invention can be widely applied to, for example, the probe inspection process in the manufacturing process of a semiconductor integrated circuit device.

The invention claimed is:
1. A manufacturing method of a semiconductor integrated circuit device comprising the steps of:
  (a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface;

(b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; a plurality of pogo pins in contact with the first wiring substrate from a second surface on the other side of a first surface on which the first sheet is attached, the pogo pins transmitting an electric signal to each of the plurality of contact terminals; a bonding ring which holds a first region in the first sheet in which the plurality of contact terminals are formed, while separating the first region from the first substrate and applying tensile forces; a pressing mechanism which presses the first region in the first sheet from a rear surface thereof; and a first fixing substrate which fixes the first wiring substrate from a side of the first surface; and (c) performing electrical inspection of the semiconductor integrated circuit by contacting the tips of the plurality of contact terminals with the plurality of first electrodes, wherein each of the tips of the plurality of contact terminals is disposed on the main surface of the first sheet, so as to oppose to corresponding one of the plurality of first electrodes, and a second region surrounding the first region in the first sheet is held to the first substrate in an unstrained state.

2. The manufacturing method of a semiconductor integrated circuit device according to claim 1,
wherein a separated distance between the first region of the first sheet and the first substrate is longer than a thickness of the first fixing substrate.

3. The manufacturing method of a semiconductor integrated circuit device according to claim 1,
wherein one or more holes are formed in the first sheet at positions away from the second wiring and the plurality of contact terminals.

4. The manufacturing method of a semiconductor integrated circuit device according to claim 3,
wherein air bubbles in the first sheet are removed through the holes to outside of the first sheet at the step (c).

5. The manufacturing method of a semiconductor integrated circuit device according to claim 1,
wherein the second wiring includes a third wiring and a fourth wiring which is formed on the third wiring and is electrically connected to the third wiring,
a fifth wiring which is not electrically connected to the third wiring is formed in a wiring layer in which the fourth wiring is formed, and
at least one of the fourth wiring and the fifth wiring is formed on each third wiring.

6. The manufacturing method of a semiconductor integrated circuit device according to claim 1, further comprising the step of:
(d) before the step (c), pressing the first sheet by the pressing mechanism at a first temperature to apply a first force to the first sheet, thereby reducing tensile force of the first sheet itself,
wherein the first temperature is a temperature at which the tensile force of the first sheet itself is reduced by applying the first force to the first sheet.

7. A manufacturing method of a semiconductor integrated circuit device comprising the steps of:
(a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface;

(b) preparing a first card including: a first wiring substrate having a first wiring formed thereon; a second fixing substrate attached to a third region on a first surface of the first wiring substrate; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the second wiring substrate, opposing to the main surface of the semiconductor wafer; a plurality of pogo pins in contact with the first wiring substrate from a second surface on the other side of the first surface, the pogo pins transmitting an electric signal to each of the plurality of contact terminals; a pressing mechanism which presses a first region in the first sheet in which the plurality of contact terminals are formed, from a rear surface thereof; and a first fixing substrate which fixes the first wiring substrate in a fourth region except the third region from a side of the first surface; and (c) performing electrical inspection of the semiconductor integrated circuit by contacting the tips of the plurality of contact terminals with the plurality of first electrodes, wherein each of the tips of the plurality of contact terminals is disposed on the main surface of the first sheet, so as to oppose to corresponding one of the plurality of first electrodes.

8. The manufacturing method of a semiconductor integrated circuit device according to claim 7,
wherein a separated distance between the first region of the first sheet and the first substrate is longer than a thickness of the first fixing substrate.

9. The manufacturing method of a semiconductor integrated circuit device according to claim 7,
wherein one or more holes are formed in the first sheet at positions away from the second wiring and the plurality of contact terminals.

10. The manufacturing method of a semiconductor integrated circuit device according to claim 9,
wherein air bubbles in the first sheet are removed through the holes to outside of the first sheet at the step (c).

11. The manufacturing method of a semiconductor integrated circuit device according to claim 7,
wherein the second wiring includes a third wiring and a fourth wiring which is formed on the third wiring and is electrically connected to the third wiring,
a fifth wiring which is not electrically connected to the third wiring is formed in a wiring layer in which the fourth wiring is formed, and
at least one of the fourth wiring and the fifth wiring is formed on each third wiring.

12. The manufacturing method of a semiconductor integrated circuit device according to claim 7, further comprising the step of:
(d) before the step (c), pressing the first sheet by the pressing mechanism at a first temperature to apply a first force to the first sheet, thereby reducing tensile force of the first sheet itself,
wherein the first temperature is a temperature at which the tensile force of the first sheet itself is reduced by applying the first force to the first sheet.

13. A manufacturing method of a semiconductor integrated circuit device comprising the steps of:
(a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface;

(b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof; and (c) performing electrical inspection of the semiconductor integrated circuit by contacting the tips of the plurality of contact terminals with the plurality of first electrodes, wherein each of the tips of the plurality of contact terminals is disposed on the main surface of the first sheet, so as to oppose to corresponding one of the plurality of first electrodes, and one or more holes are formed in the first sheet at positions away from the second wiring and the plurality of contact terminals.

14. The manufacturing method of a semiconductor integrated circuit device according to claim 13,
wherein air bubbles in the first sheet are removed through the holes to outside of the first sheet at the step (c).

15. The manufacturing method of a semiconductor integrated circuit device according to claim 13,
wherein the second wiring includes a third wiring and a fourth wiring which is formed on the third wiring and is electrically connected to the third wiring,
a fifth wiring which is not electrically connected to the third wiring is formed in a wiring layer in which the fourth wiring is formed, and
at least one of the fourth wiring and the fifth wiring is formed on each third wiring.

16. The manufacturing method of a semiconductor integrated circuit device according to claim 13, further comprising the step of:
(d) before the step (c), pressing the first sheet by the pressing mechanism at a first temperature to apply a first force to the first sheet, thereby reducing tensile force of the first sheet itself,
wherein the first temperature is a temperature at which the tensile force of the first sheet itself is reduced by applying the first force to the first sheet.

17. A manufacturing method of a semiconductor integrated circuit device comprising the steps of:
(a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface;
(b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof; and (c) performing electrical inspection of the semiconductor integrated circuit by contacting the tips of the plurality of contact terminals with the plurality of first electrodes, wherein each of the tips of the plurality of contact terminals is disposed on the main surface of the first sheet, so as to oppose to corresponding one of the plurality of first electrodes, the second wiring includes a third wiring and a fourth wiring which is formed on the third wiring and is electrically connected to the third wiring, a fifth wiring which is not electrically connected to the third wiring is formed in a wiring layer in which the fourth wiring is formed, and at least one of the fourth wiring and the fifth wiring is formed on each third wiring.

18. The manufacturing method of a semiconductor integrated circuit device according to claim 17, further comprising the step of:
(d) before the step (c), pressing the first sheet by the pressing mechanism at a first temperature to apply a first force to the first sheet, thereby reducing tensile force of the first sheet itself,
wherein the first temperature is a temperature at which the tensile force of the first sheet itself is reduced by applying the first force to the first sheet.

19. A manufacturing method of a semiconductor integrated circuit device comprising the steps of:
(a) preparing a semiconductor wafer on which a plurality of chip regions are defined, a semiconductor integrated circuit is formed in each of the plurality of chip regions, and a plurality of first electrodes electrically connected to the semiconductor integrated circuit are formed on a main surface;
(b) preparing a first card including: a first wiring substrate having a first wiring formed thereon; a first sheet on which a plurality of contact terminals for contacting with the plurality of first electrodes and a second wiring electrically connected to the plurality of contact terminals are formed, the second wiring is electrically connected to the first wiring, and tips of the plurality of contact terminals are held to the first wiring substrate, opposing to the main surface of the semiconductor wafer; and a pressing mechanism which presses a first region in the first sheet in which the plurality of contact terminals are formed, from a rear surface thereof;
(c) pressing the first sheet by the pressing mechanism at a first temperature to apply a first force to the first sheet, thereby reducing tensile force of the first sheet itself; and
(d) after the step (c), performing electrical inspection of the semiconductor integrated circuit by contacting the tips of the plurality of contact terminals with the plurality of first electrodes,
wherein each of the tips of the plurality of contact terminals is disposed on the main surface of the first sheet, so as to oppose to corresponding one of the plurality of first electrodes, and
the first temperature is a temperature at which the tensile force of the first sheet itself is reduced by applying the first force to the first sheet.

20. The manufacturing method of a semiconductor integrated circuit device according to claim 19,
wherein the first temperature is 100° C. or more.

21. The manufacturing method of a semiconductor integrated circuit device according to claim 19,
wherein the step (c) is repeated several times until the tensile force of the first sheet itself reaches a first tensile force.

* * * * *